US012548516B2

(12) United States Patent
Xiao et al.

(10) Patent No.: US 12,548,516 B2
(45) Date of Patent: *Feb. 10, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Bangqing Xiao, Beijing (CN); Yao Huang, Beijing (CN); Yu Wang, Beijing (CN); Weiyun Huang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/925,904

(22) Filed: Oct. 24, 2024

(65) Prior Publication Data

US 2025/0054446 A1  Feb. 13, 2025

Related U.S. Application Data

(63) Continuation of application No. 18/246,708, filed as application No. PCT/CN2022/102986 on Jun. 30, 2022, now Pat. No. 12,165,588.

(51) Int. Cl.
G09G 3/3233 (2016.01)
H10K 59/131 (2023.01)

(52) U.S. Cl.
CPC ......... *G09G 3/3233* (2013.01); *H10K 59/131* (2023.02); *G09G 2300/0408* (2013.01);
(Continued)

(58) Field of Classification Search
CPC .............................. G09F 9/00; G09G 3/3233; G09G 2300/0408; G09G 2300/0426;
(Continued)

(56) References Cited

U.S. PATENT DOCUMENTS

| 12,165,588 B2* | 12/2024 | Xiao ....................... H10D 99/00 |
| 2016/0163247 A1* | 6/2016 | Lee ....................... G09G 3/3233 |
| | | 438/34 |
| 2021/0193766 A1* | 6/2021 | Liu ..................... H10K 59/1213 |

* cited by examiner

*Primary Examiner* — Stacy Khoo
(74) *Attorney, Agent, or Firm* — Westman, Champlin & Koehler, P.A.

(57) ABSTRACT

A display substrate is provided, including: a base substrate; and a first pixel driving circuit, a first anode structure, a second pixel driving circuit and a second anode structure arranged on the base substrate. An orthographic projection of the first anode structure on the base substrate at least partially overlaps an orthographic projection of a driving gate conductive portion of the first pixel driving circuit on the base substrate to form a third overlapping region. An orthographic projection of the second anode structure on the base substrate at least partially overlaps an orthographic projection of a driving gate conductive portion of the second pixel driving circuit on the base substrate to form a fourth overlapping region. A ratio of an area of the third overlapping region to an area of the fourth overlapping region ranges from 0.8 to 1.2.

18 Claims, 20 Drawing Sheets

(52) U.S. Cl.
CPC ............... *G09G 2300/0426* (2013.01); *G09G 2300/0452* (2013.01); *G09G 2300/0819* (2013.01); *G09G 2300/0842* (2013.01); *G09G 2320/0233* (2013.01)

(58) Field of Classification Search
CPC ... G09G 2300/0452; G09G 2300/0814; G09G 2300/0819; G09G 2300/0842; G09G 2300/0861; G09G 2300/0866; G09G 2320/0233; H10D 99/00; H10K 59/121; H10K 59/1213; H10K 59/131; H10K 59/353
See application file for complete search history.

DISPLAY SUBSTRATE AND DISPLAY APPARATUS

This application is a continuous application of U.S. application Ser. No. 18/246,708, filed on Mar. 27, 2023, entitled "DISPLAY SUBSTRATE AND DISPLAY APPARATUS", which is a Section 371 National Stage Application of International Application No. PCT/CN2022/102986, filed on Jun. 30, 2022, entitled "DISPLAY SUBSTRATE AND DISPLAY APPARATUS", the whole disclosures of which are incorporated herein by reference in their entireties.

TECHNICAL FIELD

The present disclosure relates to a field of a display technology, and in particular, to a display substrate and a display apparatus.

BACKGROUND

OLED (Organic Light Emitting Diode) is a current-type organic light emitting device, which has a phenomenon of luminescence caused by an injection and recombination of carriers with a luminous intensity proportional to the injected current. Under an action of an electric field, holes generated by an anode structure and electrons generated by a cathode structure of the OLED may be transported and injected into a hole transporting layer and an electron transporting layer, respectively, and then be migrated to a light emitting layer. When the holes and the electrons meet in the light emitting layer, energy excitons may be generated, so that luminescent molecules may be excited and finally visible light is produced.

Brightness uniformity is one of important indicators to measure a quality of a display panel. In the existing display panel, due to different positions of opening regions of pixels, overlapping regions between the anode structures and lower pixel driving circuits have different areas, so that different parasitic capacitances are generated, which may lead to non-uniform brightness of the display panel.

The above information disclosed in this section is merely for the understanding of the background of technical concepts of the present disclosure. Therefore, the above information may contain information that does not constitute a related art.

SUMMARY

In an aspect, a display substrate is provided, including: a base substrate; and a plurality of sub-pixels on the base substrate, wherein the plurality of sub-pixels are arranged in an array in a first direction and a second direction, wherein the plurality of sub-pixels include a first-type sub-pixel and a second-type sub-pixel, the first-type sub-pixel includes a first pixel driving circuit and a first light emitting device, the first pixel driving circuit is electrically connected to the first light emitting device to drive the first light emitting device to emit light, the second-type sub-pixel includes a second pixel driving circuit and a second light emitting device, and the second pixel driving circuit is electrically connected to the second light emitting device to drive the second light emitting device to emit light; the first light emitting device includes a first anode structure, the second light emitting device includes a second anode structure, and an orthographic projection of the first anode structure on the base substrate and an orthographic projection of the second anode structure on the base substrate are arranged in different rows; the orthographic projection of the first anode structure on the base substrate at least partially overlaps an orthographic projection of an occupation region of the first pixel driving circuit on the base substrate, so as to form a first overlapping region; the orthographic projection of the second anode structure on the base substrate at least partially overlaps an orthographic projection of an occupation region of the second pixel driving circuit on the base substrate, so as to form a second overlapping region; an area of the first overlapping region is less than an area of the second overlapping region; each of the first pixel driving circuit and the second pixel driving circuit includes a driving gate conductive portion, the driving gate conductive portion of the first pixel driving circuit includes a third gate electrode of a third transistor serving as a driving transistor of the first pixel driving circuit and a first connecting portion electrically connected to the third gate electrode, and the driving gate conductive portion of the second pixel driving circuit includes a third gate electrode of a third transistor serving as a driving transistor of the second pixel driving circuit and a first connecting portion electrically connected to the third gate electrode; the orthographic projection of the first anode structure on the base substrate at least partially overlaps an orthographic projection of the driving gate conductive portion of the first pixel driving circuit on the base substrate, so as to form a third overlapping region; the orthographic projection of the second anode structure on the base substrate at least partially overlaps an orthographic projection of the driving gate conductive portion of the second pixel driving circuit on the base substrate, so as to form a fourth overlapping region; and a ratio of an area of the third overlapping region to an area of the fourth overlapping region is in a range from 0.8 to 1.2.

According to some exemplary embodiments, an area of the orthographic projection of the driving gate conductive portion of the first pixel driving circuit on the base substrate is greater than an area of the orthographic projection of the driving gate conductive portion of the second pixel driving circuit on the base substrate.

According to some exemplary embodiments, an area of an orthographic projection of the first connecting portion of the first pixel driving circuit on the base substrate is greater than an area of an orthographic projection of the first connecting portion of the second pixel driving circuit on the base substrate.

According to some exemplary embodiments, a ratio of an area of an orthographic projection of the third gate electrode of the first pixel driving circuit on the base substrate to an area of an orthographic projection of the third gate electrode of the second pixel driving circuit on the base substrate is in a range from 0.8 to 1.2.

According to some exemplary embodiments, the first anode structure includes an anode body portion and an anode extension portion extending from the anode body portion to the first pixel driving circuit, an orthographic projection of the third gate electrode and the first connecting portion of the first pixel driving circuit on the base substrate at least partially overlaps an orthographic projection of the anode extension portion of the first anode structure on the base substrate, so as to form the third overlapping region.

According to some exemplary embodiments, the orthographic projection of the third gate electrode and the first connecting portion of the first pixel driving circuit on the base substrate is spaced apart from an orthographic projection of the anode body portion of the first anode structure on the base substrate.

According to some exemplary embodiments, an orthographic projection of the third gate electrode and the first connecting portion of the second pixel driving circuit on the base substrate at least partially overlaps an orthographic projection of the anode body portion of the second anode structure on the base substrate, so as to form the fourth overlapping region.

According to some exemplary embodiments, each of the first pixel driving circuit and the second pixel driving circuit includes a storage capacitor, the storage capacitor includes a first storage capacitor electrode and a second storage capacitor electrode, an orthographic projection of the first storage capacitor electrode on the base substrate at least partially overlaps an orthographic projection of the second storage capacitor electrode on the base substrate, the first storage capacitor electrode includes the driving gate conductive portion, and an area of the orthographic projection of the second storage capacitor electrode of the first pixel driving circuit on the base substrate is less than an area of the orthographic projection of the second storage capacitor electrode of the second pixel driving circuit on the base substrate.

According to some exemplary embodiments, the orthographic projection of the driving gate conductive portion of the first pixel driving circuit on the base substrate at least partially overlaps the orthographic projection of the second storage capacitor electrode of the first pixel driving circuit on the base substrate, so as to form a fifth overlapping region; the orthographic projection of the driving gate conductive portion of the second pixel driving circuit on the base substrate at least partially overlaps the orthographic projection of the second storage capacitor electrode of the second pixel driving circuit on the base substrate, so as to form a sixth overlapping region; and a ratio of an area of the fifth overlapping region to an area of the sixth overlapping region is in a range from 0.8 to 1.2.

According to some exemplary embodiments, the display substrate includes: a semiconductor layer on the base substrate; a first conductive layer on a side of the semiconductor layer away from the base substrate; a second conductive layer on a side of the first conductive layer away from the base substrate; a third conductive layer on a side of the second conductive layer away from the base substrate; and a first electrode layer on a side of the third conductive layer away from the base substrate, wherein the third gate electrode is located in the first conductive layer, the second storage capacitor electrode is located in the second conductive layer, the first connecting portion is located in the third conductive layer, and the first anode structure and the second anode structure are located in the first electrode layer.

According to some exemplary embodiments, the second storage capacitor electrode includes a body portion and a via hole in the body portion, the via hole exposes a part of the third gate electrode covered by the second storage capacitor electrode, and the first connecting portion is electrically connected to the third gate electrode through the via hole; and the first connecting portion of the first pixel driving circuit includes a conductive plug, an orthographic projection of the conductive plug on the base substrate falls within an orthographic projection of the via hole of the second storage capacitor electrode of the first pixel driving circuit on the base substrate, and an area of the orthographic projection of the conductive plug of the first pixel driving circuit on the base substrate is greater than an area of an orthographic projection of a conductive plug of the second pixel driving circuit on the base substrate.

According to some exemplary embodiments, the first connecting portion of the first pixel driving circuit further includes a first connecting sub-portion and a second connecting sub-portion, and the first connecting sub-portion, the conductive plug and the second connecting sub-portion are formed as an integral structure; and an orthographic projection of the first connecting sub-portion on the base substrate and an orthographic projection of the second connecting sub-portion on the base substrate are on opposite sides of the orthographic projection of the via hole on the base substrate.

According to some exemplary embodiments, an area of the orthographic projection of the via hole of the second storage capacitor electrode of the first pixel driving circuit on the base substrate is greater than an area of the orthographic projection of the via hole of the second storage capacitor electrode of the second pixel driving circuit on the base substrate.

According to some exemplary embodiments, the plurality of sub-pixels include adjacent $(n+1)^{th}$ row of sub-pixels and $n^{th}$ row of sub-pixels, the $(n+1)^{th}$ row of sub-pixels includes a plurality of first-type sub-pixels, the $n^{th}$ row of sub-pixels includes a plurality of second-type sub-pixels, and n is a positive integer; and orthographic projections of the first pixel driving circuits of the plurality of first-type sub-pixels in the $(n+1)^{th}$ row of sub-pixels on the base substrate and orthographic projections of the second pixel driving circuits of the plurality of second-type sub-pixels in the $n^{th}$ row of sub-pixels on the base substrate are arranged side by side in a same row in the first direction.

According to some exemplary embodiments, orthographic projections of the first anode structures of the plurality of first-type sub-pixels in the $(n+1)^{th}$ row of sub-pixels on the base substrate and orthographic projections of the second anode structures of the plurality of second-type sub-pixels in the $n^{th}$ row of sub-pixels on the base substrate are arranged in different rows, and the first anode structures and the second anode structures are alternately arranged in the first direction.

According to some exemplary embodiments, the anode extension portion of the first anode structure of the plurality of first-type sub-pixels in the $(n+1)^{th}$ row of sub-pixels is between the second anode structures of two second-type sub-pixels in the $n^{th}$ row of sub-pixels in the first direction.

According to some exemplary embodiments, the display substrate includes a plurality of pixel units on the base substrate, and each of the pixel units includes a first-color sub-pixel, a second-color sub-pixel and a third-color sub-pixel; and at least one selected from the first-color sub-pixel, the second-color sub-pixel or the third-color sub-pixel in a same pixel unit is the first-type sub-pixel, and at least another one selected from the first-color sub-pixel, the second-color sub-pixel or the third-color sub-pixel in the same pixel unit is the second-type sub-pixel.

According to some exemplary embodiments, for any two pixel units adjacent in the first direction, one of the first-color sub-pixel, the second-color sub-pixel and the third-color sub-pixel in one pixel unit is the first-type sub-pixel, and two of the first-color sub-pixel, the second-color sub-pixel and the third-color sub-pixel in the other pixel unit are the first type sub-pixels.

According to some exemplary embodiments, for the first-color sub-pixel, the second-color sub-pixel and the third-color sub-pixel belonging to the first-type sub-pixel, an area of an orthographic projection of the first connecting portion of the first pixel driving circuit of the third-color sub-pixel on the base substrate is greater than an area of an orthographic projection of the first connecting portion of the first pixel driving circuit of the second-color sub-pixel on the base substrate; and/or for the first-color sub-pixel, the second-color sub-pixel and the third-color sub-pixel belonging to the first-type sub-pixel, an area of an orthographic projection of the first connecting portion of the first pixel driving circuit of the second-color sub-pixel on the base substrate is greater than an area of an orthographic projection of the first connecting portion of the first pixel driving circuit of the first-color sub-pixel on the base substrate.

According to some exemplary embodiments, the display substrate further includes: a data signal line configured to transmit a data signal; and a driving voltage line configured to transmit a driving voltage; the data signal line, the driving voltage line and the first connecting portion are located in the third conductive layer; and the data signal line, the driving voltage line and the first connecting portion extend in the second direction.

According to some exemplary embodiments, for same-color sub-pixels belonging to the first-type sub-pixel and the second-type sub-pixel respectively, a ratio of an area of an orthographic projection of the first connecting portion of the first pixel driving circuit on the base substrate to an area of an orthographic projection of the first connecting portion of the second pixel driving circuit on the base substrate is in a range from 1.1 to 1.8.

According to some exemplary embodiments, a width of the anode extension portion of the first anode structure in the first direction is less than a width of the anode body portion of the first anode structure in the first direction.

According to some exemplary embodiments, for the adjacent $(n+1)^{th}$ row of sub-pixels and $n^{th}$ row of sub-pixels, the first anode structures of the first-type sub-pixels are electrically connected to respective first pixel driving circuits through respective anode connection holes, and the second anode structures of the second-type sub-pixels are electrically connected to respective second pixel driving circuits through respective anode connection holes; and for the adjacent $(n+1)^{th}$ row of sub-pixels and $n^{th}$ row of sub-pixels, the anode connection holes of the first-type sub-pixels and the anode connection holes of the second-type sub-pixels are substantially on a same straight line.

According to some exemplary embodiments, the orthographic projection of the first anode structure on the base substrate covers an orthographic projection of the anode connection hole of the first anode structure on the base substrate; and the anode body portion and the anode extension portion of the first anode structure are on opposite sides of the anode connection hole of the first anode structure in the second direction.

According to some exemplary embodiments, an orthographic projection of the first pixel driving circuit on the base substrate and an orthographic projection of the second pixel driving circuit on the base substrate are arranged side by side in a same row in the first direction.

According to some exemplary embodiments, the display substrate further includes a shielding portion in the second conductive layer, the driving voltage line includes a bending portion bending in a direction away from a data signal line adjacent to the driving voltage line, and an orthographic projection of the bending portion of the driving voltage line on the base substrate at least partially overlaps an orthographic projection of the shielding portion on the base substrate.

In another aspect, a display apparatus is provided, including the above-mentioned display substrate.

BRIEF DESCRIPTION OF THE DRAWINGS

By describing in detail exemplary embodiments of the present disclosure with reference to the accompanying drawings, features and advantages of the present disclosure will become more apparent, in the drawings:

FIG. 4 to FIG. 18 are partial plan views of a display substrate according to embodiments of the present disclosure, which schematically show plan views of sub-pixels included in the display substrate, in which:

FIG. 4 shows a partial plan view of a semiconductor layer included in the display substrate according to embodiments of the present disclosure, FIG. 5 shows a partial plan view of a first conductive layer included in the display substrate according to embodiments of the present disclosure, FIG. 6 shows a partial plan view of a combination of the semiconductor layer and the first conductive layer included in the display substrate according to embodiments of the present disclosure, FIG. 8 shows a partial plan view of a combination of the semiconductor layer, the first conductive layer and the second conductive layer included in the display substrate according to embodiments of the present disclosure, FIG. 9 shows a partial plan view of a first insulation layer included in the display substrate according to embodiments of the present disclosure, FIG. 10 shows a partial plan view of a combination of the semiconductor layer, the first conductive layer, the second conductive layer and the first insulation layer included in the display substrate according to embodiments of the present disclosure, FIG. 11 shows a partial plan view of a third conductive layer included in the display substrate according to embodiments of the present disclosure, FIG. 12 shows a partial plan view of a combination of the semiconductor layer, the first conductive layer, the second conductive layer, the first insulation layer and the third conductive layer included in the display substrate according to embodiments of the present disclosure, FIG. 13 shows a partial plan view of a second insulation layer included in the display substrate according to embodiments of the present disclosure, FIG. 14 shows a partial plan view of a combination of the semiconductor layer, the first conductive layer, the second conductive layer, the first insulation layer, the third conductive layer and the second insulation layer included in the display substrate according to embodiments of the present disclosure, FIG. 15 shows a partial plan view of a first electrode layer included in the display substrate according to embodiments of the present disclosure, FIG. 16 shows a partial plan view of a combination of the semiconductor layer, the first conductive layer, the second conductive layer, the first insulation layer, the third conductive layer, the second insulation layer and the first electrode layer included in the display substrate according to embodiments of the present disclosure, FIG. 17 shows a partial plan view of a pixel definition layer included in the display substrate according to embodiments of the present disclosure, and FIG. 18 shows a partial plan view of a combination of the semiconductor layer, the first conductive layer, the second conductive layer, the first insulation layer, the third conductive layer, the second insulation layer, the first electrode layer and the pixel definition layer included in the display substrate according to embodiments of the present disclosure;

DETAILED DESCRIPTION OF EMBODIMENTS

Figure 1:
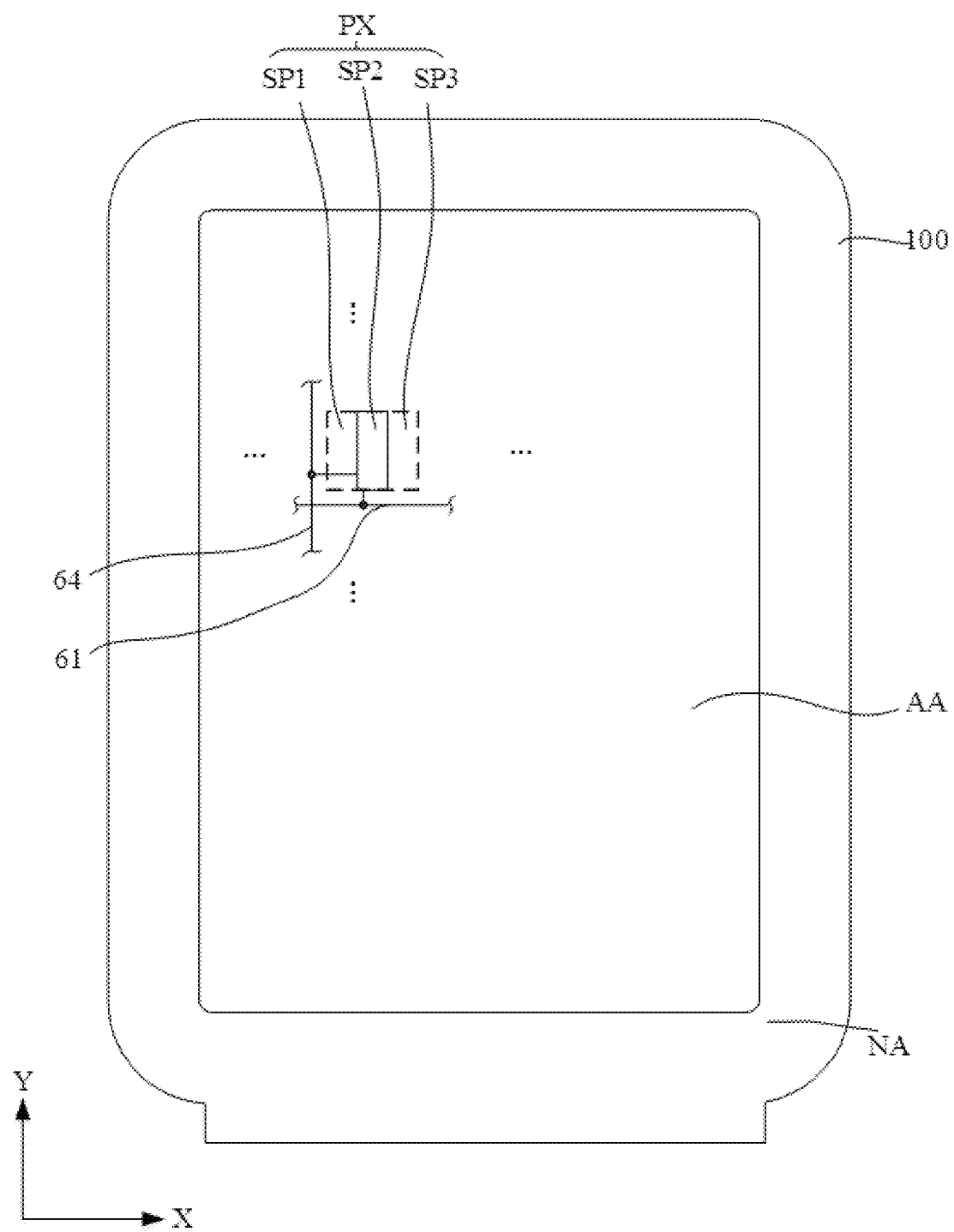
FIG. 1 shows a schematic plan view of a display substrate according to some embodiments of the present disclosure.

In order to make objectives, technical solutions and advantages of the present disclosure clearer, the technical solutions of embodiments of the present disclosure will be clearly and completely described below with reference to the accompanying drawings. Obviously, the described embodiments are merely some embodiments of the present disclosure, rather than all embodiments. Based on the described embodiments of the present disclosure, all additional embodiments obtained by those ordinary skilled in the art without carrying out inventive effort fall within the scope of protection of the present disclosure.

It should be noted that in the accompanying drawings, for clarity and/or description purposes, a size and relative size of an element may be enlarged. Accordingly, the size and relative size of each element need not to be limited to those shown in the figures. In the specification and the accompanying drawings, the same or similar reference numerals represent the same or similar components.

When an element is described as being "on", "connected to" or "coupled to" another element, the element may be directly on the another element, directly connected to the another element, or directly coupled to the another element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent to" and "directly adjacent to", "on" and "directly on", and so on, should be interpreted in a similar manner. Moreover, the term "connection" may refer to a physical connection, an electrical connection, a communicative connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other.

For objectives of the present disclosure, "at least one selected from X, Y or Z" and "at least one selected from a group consisting of X, Y and Z" may be interpreted as only X, only Y, only Z, or any combination of two or more of X, Y and Z, such as XYZ, YZ and ZZ. As used herein, the term "and/or" includes any and all combinations of one or more of the listed related items.

It should be noted that although the terms "first", "second", and so on may be used herein to describe various components, members, elements, regions, layers and/or portions, these components, members, elements, regions, layers and/or portions should not be limited by these terms. Rather, these terms are used to distinguish one component, member, element, region, layer and/or portion from another one. Thus, for example, a first component, a first member, a first element, a first region, a first layer and/or a first portion discussed below may be referred to as a second component, a second member, a second element, a second region, a second layer and/or a second portion without departing from teachings of the present disclosure.

For ease of description, spatial relationship terms, such as "upper", "lower", "left", "right", may be used herein to describe a relationship between an element or feature and another element or feature as shown in the figures. It should be understood that the spatial relationship terms are intended to cover other different orientations of an apparatus in use or operation in addition to the orientation described in the figures. For example, if an apparatus in the figures is turned upside down, an element or feature described as "below" or "under" another element or feature will be oriented "above" or "on" the another element or feature.

Here, the terms "substantially", "about", "approximately" and other similar terms are used as terms of approximation rather than terms of degree, and they are intended to explain an inherent deviation of a measured or calculated value that will be recognized by those ordinary skilled in the art. Taking into account a process fluctuation, a measurement problem and an error related to a measurement of a specific quantity (that is, a limitation of a measurement system), the terms "substantially", "about" or "approximately" used herein includes a stated value and means that a specific value determined by those ordinary skilled in the art is within an acceptable range of deviation. For example, "about" may mean being within one or more standard deviations, or within ±30%, ±20%, ±10% or ±5% of the stated value.

It should be noted that the expressions "the same layer" herein refer to a layer structure that is formed by firstly forming, using a same film forming process, a film layer used to form a specific pattern, and then patterning, using one-time patterning process, the film layer with a same mask. Depending on different specific patterns, the one-time patterning process may include a plurality of exposure, development or etching processes, and the specific pattern in the formed layer structure may be continuous or discontinuous. That is, a plurality of elements, components, structures and/or portions located in the "same layer" are made of the same material and formed by the same patterning process. Generally, a plurality of elements, components, structures and/or portions located in the "same layer" have substantially the same thickness.

Those skilled in the art should understand that, unless otherwise specified, the expressions "continuously extending", "integral structure", "overall structure" or similar expressions herein mean that a plurality of elements, components, structures and/or portions are located in the same layer and generally formed by the same patterning process during the manufacturing process, and that these elements, components, structures and/or portions are not separated or broken, but are formed as a continuously extending structure.

Herein, directional expressions "first direction" and "second direction" are used to describe different directions along a pixel region, e.g., a longitudinal direction and a lateral direction of the pixel region. It should be understood that such expressions are merely exemplary descriptions and are not limitations to the present disclosure.

Herein, the expression "row" is used to describe a positional relationship of a component on a display substrate in a certain direction (for example, a first direction). It should be noted that unless otherwise specified, the positional relationship is described for a same type of components. For example, pixel driving circuits, anode structures, openings and other components may be arranged on the display substrate. For the pixel driving circuits, rows of pixel driving circuits and an arrangement thereof may be provided. For the anode structures, rows of anode structures and an arrangement thereof may be provided.

Transistors used in embodiments of the present disclosure may all be thin film transistors or field effect transistors or other devices with the same characteristics. Since a source electrode and a drain electrode of the thin film transistor used herein are symmetrical, the source electrode and the drain electrode may be interchanged. In embodiments of the present disclosure, the transistor may include a gate electrode, a first electrode and a second electrode. The first electrode may represent one of the source electrode and the drain electrode, and the second electrode may represent the other of the source electrode and the drain electrode. In the following examples, a case of a P-type thin film transistor serving as a driving transistor is mainly described, and the other transistors are of the same or different type as or from the driving transistor according to a circuit design. Similarly, in other embodiments, the driving transistor may also be shown as an N-type thin film transistor.

Herein, the expression "PPI" (Pixels Per Inch) represents a pixel density, which represents a number of pixels per inch. Generally, the higher the PPI value is, the higher the density at which the display apparatus may display an image is.

Embodiments of the present disclosure provide at least a display substrate and a display apparatus. The display substrate includes a base substrate and a plurality of sub-pixels on the base substrate. The plurality of sub-pixels are arranged in an array in a first direction and a second direction. The plurality of sub-pixels include a first-type sub-pixel and a second-type sub-pixel. The first-type sub-pixel includes a first pixel driving circuit and a first light emitting device, and the first pixel driving circuit is electrically connected to the first light emitting device to drive the first light emitting device to emit light. The second-type sub-pixel includes a second pixel driving circuit and a second light emitting device, and the second pixel driving circuit is electrically connected to the second light emitting device to drive the second light emitting device to emit light. The first light emitting device includes a first anode structure, and the second light emitting device includes a second anode structure. An orthographic projection of the first anode structure on the base substrate and an orthographic projection of the second anode structure on the base substrate are arranged in different rows. The orthographic projection of the first anode structure on the base substrate at least partially overlaps an orthographic projection of an occupation region of the first pixel driving circuit on the base substrate, so as to form a first overlapping region. The orthographic projection of the second anode structure on the base substrate at least partially overlaps an orthographic projection of an occupation region of the second pixel driving circuit on the base substrate, so as to form a second overlapping region. An area of the first overlapping region is less than an area of the second overlapping region. Each of the first pixel driving circuit and the second pixel driving circuit includes a driving gate conductive portion. The driving gate conductive portion of the first pixel driving circuit includes a third gate electrode of a third transistor serving as a driving transistor of the first pixel driving circuit and a first connecting portion electrically connected to the third gate electrode. The driving gate conductive portion of the second pixel driving circuit includes a third gate electrode of a third transistor serving as a driving transistor of the second pixel driving circuit and a first connecting portion electrically connected to the third gate electrode. The orthographic projection of the first anode structure on the base substrate at least partially overlaps an orthographic projection of the driving gate conductive portion of the first pixel driving circuit on the base substrate, so as to form a third overlapping region. The orthographic projection of the second anode structure on the base substrate at least partially overlaps an orthographic projection of the driving gate conductive portion of the second pixel driving circuit on the base substrate, so as to form a fourth overlapping region. A ratio of an area of the third overlapping region to an area of the fourth overlapping region is in a range from 0.8 to 1.2. In embodiments of the present disclosure, with a design of the first connecting portion, an overlapping area of the whole of the first connecting portion and the gate electrode of the third transistor with the upper anode structure is substantially the same in the two types of sub-pixels, so that capacitive loads between nodes N4 and nodes N1 are substantially the same, and brightness non-uniformity may be at least mitigated or even eliminated.

FIG. 1 shows a schematic plan view of a display substrate according to embodiments of the present disclosure. Referring to FIG. 1, the display substrate according to embodiments of the present disclosure may include a base substrate 100 and a pixel unit PX on the base substrate 100.

The display substrate may include a display region AA and a non-display region NA. The display region AA may be a region in which the pixel unit PX for displaying an image is provided. The pixel unit PX will be described later. The non-display region NA is a region in which no pixel unit PX is provided, that is, a region in which no image is displayed. The non-display region NA corresponds to a bezel in a resultant display apparatus, and a width of the bezel may be determined according to a width of the non-display region NA.

The display region AA may have various shapes. For example, the display region AA may have various shapes such as a closed polygon including a straight side (e.g., a rectangle); a circle or an ellipse, etc. including a curved side; and a semicircle or a semi-ellipse, etc. including a straight side and a curved side. In embodiments of the present disclosure, the display region AA is set as a region having a quadrangular shape including straight sides. It should be understood that this is merely an exemplary embodiment of the present disclosure, rather than a limitation to the present disclosure.

The non-display region NA may be arranged on at least one side of the display region AA. In embodiments of the present disclosure, the non-display region NA may surround a periphery of the display region AA. In embodiments of the present disclosure, the non-display region NA may include a lateral portion extending in a first direction X and a longitudinal portion extending in a second direction Y.

The pixel unit PX is arranged in the display region AA. The pixel unit PX is a minimum unit for displaying an image, and a plurality of pixel units may be provided. For example, the pixel unit PX may include light emitting devices that emit white light and/or color light.

A plurality of pixel units PX may be provided in a form of a matrix along rows extending in the first direction X and columns extending in the second direction Y. However, embodiments of the present disclosure do not specifically limit an arrangement form of the pixel units PX, and the pixel units PX may be arranged in various forms. For example, the pixel units PX may be arranged such that a direction inclined with respect to the first direction X and the second direction Y is a column direction, and a direction intersecting the column direction is a row direction.

The plurality of pixel units PX are arranged in an array in the first direction X and the second direction Y, so as to form a plurality of rows of pixel units and a plurality of columns of pixel units.

One pixel unit PX may include a plurality of sub-pixels. For example, one pixel unit PX may include three sub-pixels, including a first-color sub-pixel SP1, a second-color sub-pixel SP2 and a third-color sub-pixel SP3. For example, the first-color sub-pixel SP1 may be a red sub-pixel, the second-color sub-pixel SP2 may be a green sub-pixel, and the third-color sub-pixel SP3 may be a blue sub-pixel.

It should be noted that in embodiments of the present disclosure, the number of sub-pixels included in one pixel unit is not particularly restricted, and is not limited to the above-mentioned three.

For example, in exemplary embodiments shown in FIG. 1, a scanning signal line 61 and a data line 64 are schematically shown. That is, the display substrate may further include a plurality of scanning signal lines 61 and a plurality of data lines 64 on the base substrate. The plurality of scanning signal lines 61 supply scanning signals respectively to the plurality of rows of pixel units, and the plurality of data lines 64 supply data signals respectively to the plurality of columns of pixel units. The scanning signal line 61 extend in the first direction X, and the plurality of scanning signal lines 61 are spaced apart from each other in the second direction Y. The data line 64 extends in the second direction Y, and the plurality of data lines 64 are spaced apart from each other in the first direction X.

For example, the scanning signal line may be a representative of lateral wires, and the data line may be a representative of longitudinal wires. It should be understood that the lateral wires may further include other types of wires or wires used to supply other signals, and the longitudinal wires may further include other types of wires or wires used to supply other signals.

Each sub-pixel may include a light emitting device and a pixel driving circuit used to drive the light emitting device. For example, in an OLED display substrate or display panel, the light emitting device of the sub-pixel may include an anode structure, a luminescent material layer and a cathode structure that are arranged in a stack. The anode structures of the light emitting devices of the sub-pixels are spaced apart from each other, and are thus arranged in a form of a matrix along rows extending in the first direction X and columns extending in the second direction Y.

Herein, for the convenience of description, in each plan view, a sub-pixel is represented by an orthographic projection of the anode structure of the light emitting device of the sub-pixel on the base substrate.

Figure 2A:
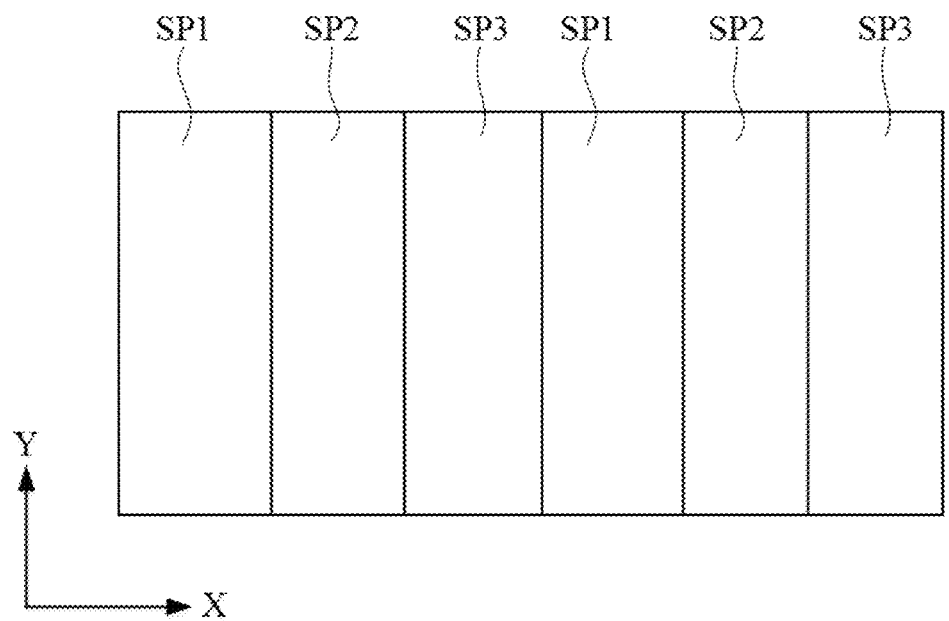
FIG. 2A shows a schematic plan view of a plurality of sub-pixels of a display substrate according to some exemplary embodiments of the present disclosure.
Figure 2B:
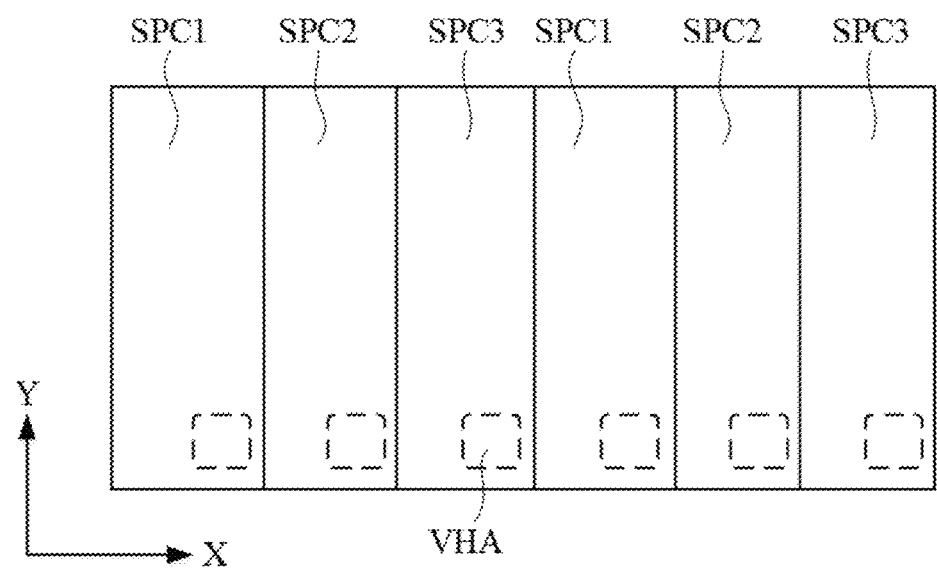
FIG. 2B shows a schematic plan view of a plurality of sub-pixels and respective pixel driving circuits of a display substrate according to some exemplary embodiments of the present disclosure.

FIG. 2A shows a schematic plan view of a plurality of sub-pixels of a display substrate according to some exemplary embodiments of the present disclosure, and FIG. 2B shows a schematic plan view of the plurality of sub-pixels and respective pixel driving circuits of a display substrate according to some exemplary embodiments of the present disclosure.

Referring to FIG. 1, FIG. 2A and FIG. 2B, the display substrate may include a plurality of sub-pixels on the base substrate 100, and the plurality of sub-pixels are arranged in a form of a matrix (that is, in an array) in the first direction X and the second direction Y, so as to form a plurality of rows of sub-pixels and a plurality of columns of sub-pixels.

Figure 15:
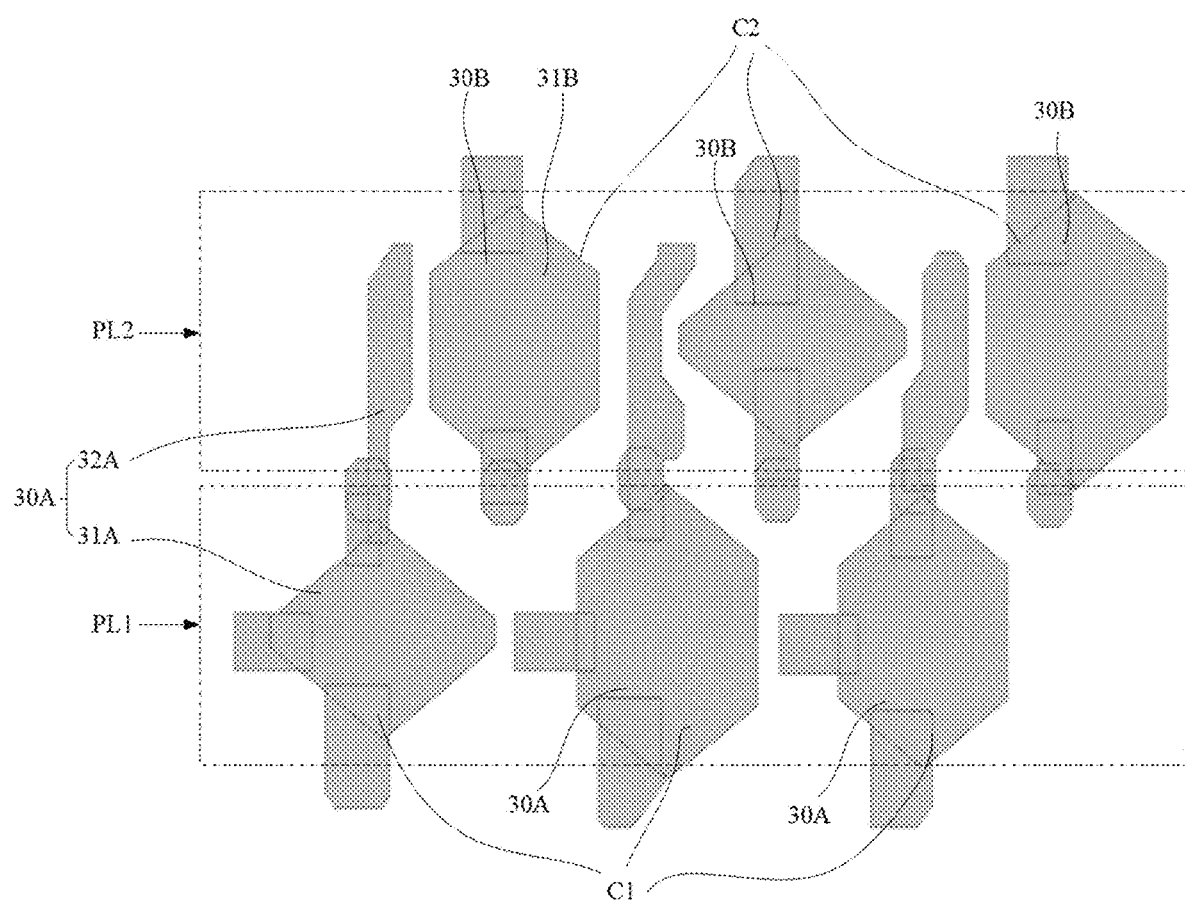

For example, FIG. 2A schematically shows two adjacent pixel units PX, including six sub-pixels arranged in different rows. Specifically, in embodiments shown in FIG. 2A and FIG. 2B, two adjacent rows of sub-pixels are schematically shown, that is, an $(n+1)^{th}$ row of sub-pixels PL1 and an $n^{th}$ row of sub-pixels PL2. These two rows of sub-pixels may be regarded as representatives of adjacent odd-numbered row of sub-pixels and even-numbered row of sub-pixels. As shown in FIG. 15, the orthographic projection of the anode structure of each sub-pixel in the $(n+1)^{th}$ row of sub-pixels PL1 on the base substrate 100 and the orthographic projection of the anode structure of each sub-pixel in the $n^{th}$ row of sub-pixels PL2 on the base substrate 100 are arranged in different rows.

For example, each row of sub-pixels includes the first-color sub-pixel SP1, the second-color sub-pixel SP2 and the third-color sub-pixel SP3 that are arranged repeatedly. Two adjacent rows of sub-pixels are staggered. In each two adjacent rows of sub-pixels, a second-color sub-pixel SP2 in one row of sub-pixels forms a pixel unit PX with a first-color sub-pixel SP1 and a third-color sub-pixel SP3 in the other row of sub-pixels that are adjacent to the second-color sub-pixel SP2, and in the pixel unit PX, a brightness center of the first-color sub-pixel SP1, a brightness center of the second-color sub-pixel SP2 and a brightness center of the third-color sub-pixel SP3 are respectively located at vertices of an equilateral triangle.

The first-color sub-pixel SP1 may include a first light emitting device located in a first light emitting region and a pixel driving circuit SPC1 used to drive the first light emitting device, and the first light emitting device may emit red light. The second-color sub-pixel SP2 may include a second light emitting device located in a second light emitting region and a pixel driving circuit SPC2 used to drive the second light emitting device, and the second light emitting device may emit green light. The third-color sub-pixel SP3 may include a third light emitting device located in a third light emitting region and a pixel driving circuit SPC3 used to drive the third light emitting device, and the third light emitting device may emit blue light.

It should be noted that the light emitting region of the sub-pixel may be a region where the light emitting device of the sub-pixel is located. For example, the light emitting region of the sub-pixel may be a region corresponding to the anode structure of the light emitting device of the sub-pixel, or the light emitting region of the sub-pixel may be a region corresponding to a portion of the luminescent material layer between the anode structure and the cathode structure.

In embodiments of the present disclosure, in the $(n+1)^{th}$ row of sub-pixels PL1 and the $n^{th}$ row of sub-pixels PL2, the pixel driving circuits of the sub-pixels SP1, SP2 and SP3, i.e., the pixel driving circuit SPC1, the pixel driving circuit SPC2 and the pixel driving circuit SPC3, are arranged side by side in a same row in the first direction X, that is, laterally arranged side by side.

In FIG. 2B, an anode connection hole VHA is schematically shown with a dashed box. The anode structure of the light emitting device of each sub-pixel may be electrically connected to a lower pixel driving circuit through the anode connection hole VHA, so that the pixel driving circuit of each sub-pixel may drive the corresponding light emitting device. In the $(n+1)^{th}$ row of sub-pixels PL1 and the $n^{th}$ row of sub-pixels PL2, the anode connection holes VHA of the sub-pixels SP1, SP2 and SP3 are substantially on a same straight line, that is, a connection line of geometric centers of the anode connection holes VHA of the sub-pixels SP1, SP2 and SP3 is substantially parallel to the first direction X.

It should be understood that when the anode connection hole VHA of each of the sub-pixels SP1, SP2 and SP3 is a rectangle, the geometric center of the anode connection hole VHA is a point of intersection of two diagonal lines of the rectangle; and when the anode connection hole VHA of each of the sub-pixels SP1, SP2 and SP3 is a circle, the geometric center of the anode connection hole VHA is a center of the circle.

In the examples shown in FIG. 2A and FIG. 2B, in the $(n+1)^{th}$ row of sub-pixels PL1 and the $n^{th}$ row of sub-pixels PL2, the orthographic projections of the anode structures of the light emitting devices of the sub-pixels SP1, SP2 and SP3 on the base substrate are arranged in two adjacent rows, and the pixel driving circuits of the sub-pixels SP1, SP2 and SP3 are arranged in a same row, that is, laterally arranged side by side. Such pixel layout is beneficial to obtain a display substrate with high PPI.

Figure 16:
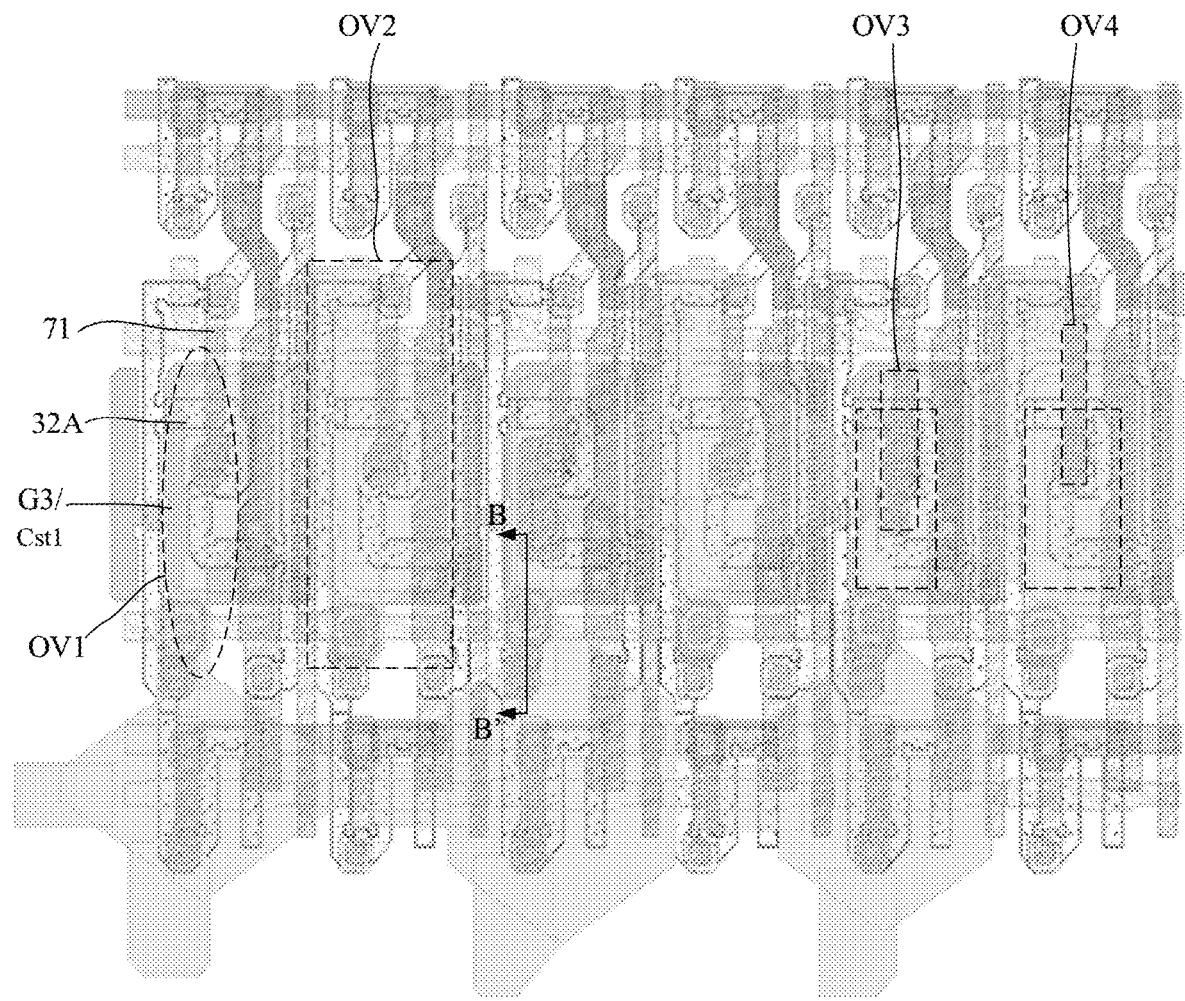
Figure 18:
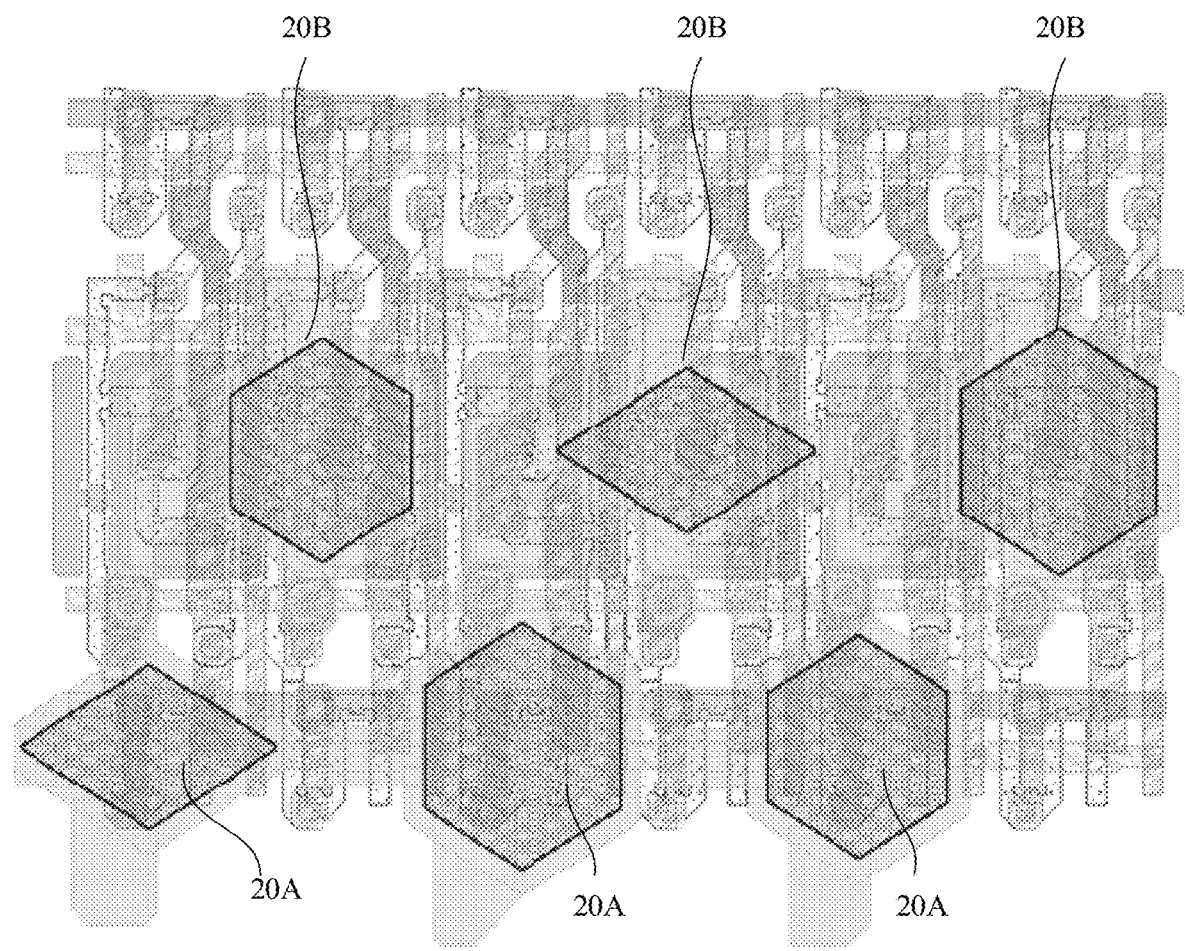

Referring to FIG. 2B, FIG. 16 and FIG. 18, a relative positional relationship between an anode structure of a sub-pixel and a lower pixel driving circuit of the sub-pixel is different from a relative positional relationship between an anode structure of another sub-pixel and a lower pixel driving circuit of the another sub-pixel. For example, an overlapping area between the orthographic projection of the anode structure of each sub-pixel in the $(n+1)^{th}$ row of sub-pixels PL1 on the base substrate and the orthographic projection of the pixel driving circuit of the sub-pixel on the base substrate is less than an overlapping area between the orthographic projection of the anode structure of each sub-pixel in the $n^{th}$ row of sub-pixels PL2 on the base substrate and the orthographic projection of the pixel driving circuit of the sub-pixel on the base substrate. The anode structure of each sub-pixel in the $n^{th}$ row of sub-pixels PL2 covers most of the pixel driving circuit of the sub-pixel, and the anode structure of each sub-pixel in the $(n+1)^{th}$ row of sub-pixels PL1 covers only a small part of the pixel driving circuit of the sub-pixel. For the convenience of description, the plurality of sub-pixels are divided into a first-type sub-pixel C1 and a second-type sub-pixel C2.

Accordingly, the first-type sub-pixel C1 includes a first pixel driving circuit and a first light emitting device. The first pixel driving circuit is electrically connected to the first light emitting device to drive the first light emitting device to emit light. The second-type sub-pixel C2 includes a second pixel driving circuit and a second light emitting device. The second pixel driving circuit is electrically connected to the second light emitting device to drive the second light emitting device to emit light.

The first-type sub-pixel and the second-type sub-pixel will be described in detail below with reference to the accompanying drawings. It should be noted that the first direction X and the second direction Y are perpendicular to each other in the illustrated embodiments, but embodiments of the present disclosure are not limited thereto. Hereinafter, a 7T1C pixel driving circuit is illustrated by way of example in describing a structure of the pixel driving circuit of the sub-pixel in detail. However, embodiments of the present disclosure are not limited to the 7T1C pixel driving circuit, and other known pixel driving circuit structures may be applied to embodiments of the present disclosure in a case of no conflict.

Figure 3:
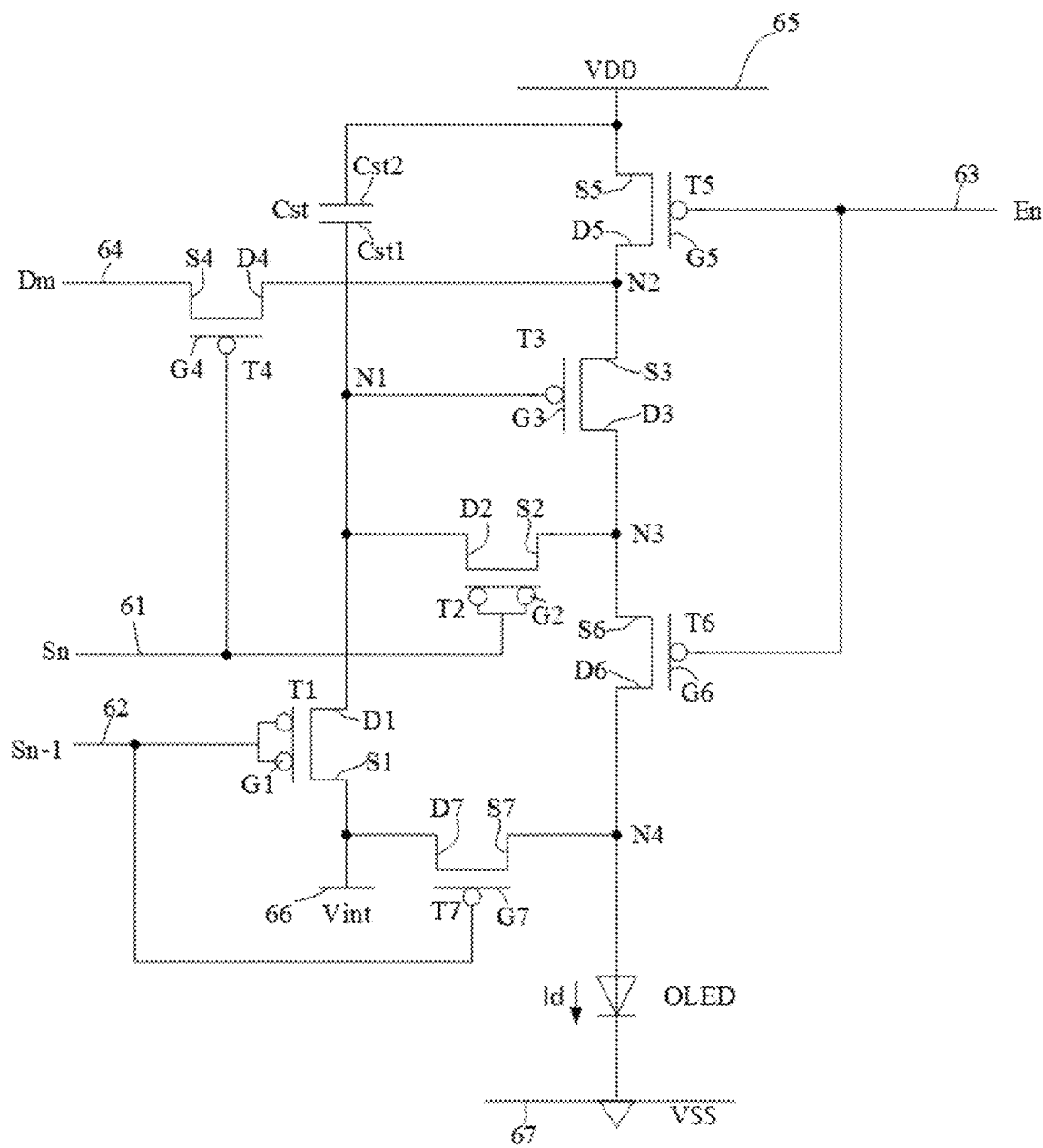
FIG. 3 shows an equivalent circuit diagram of a pixel driving circuit of a display substrate according to some exemplary embodiments of the present disclosure.
Figure 4:
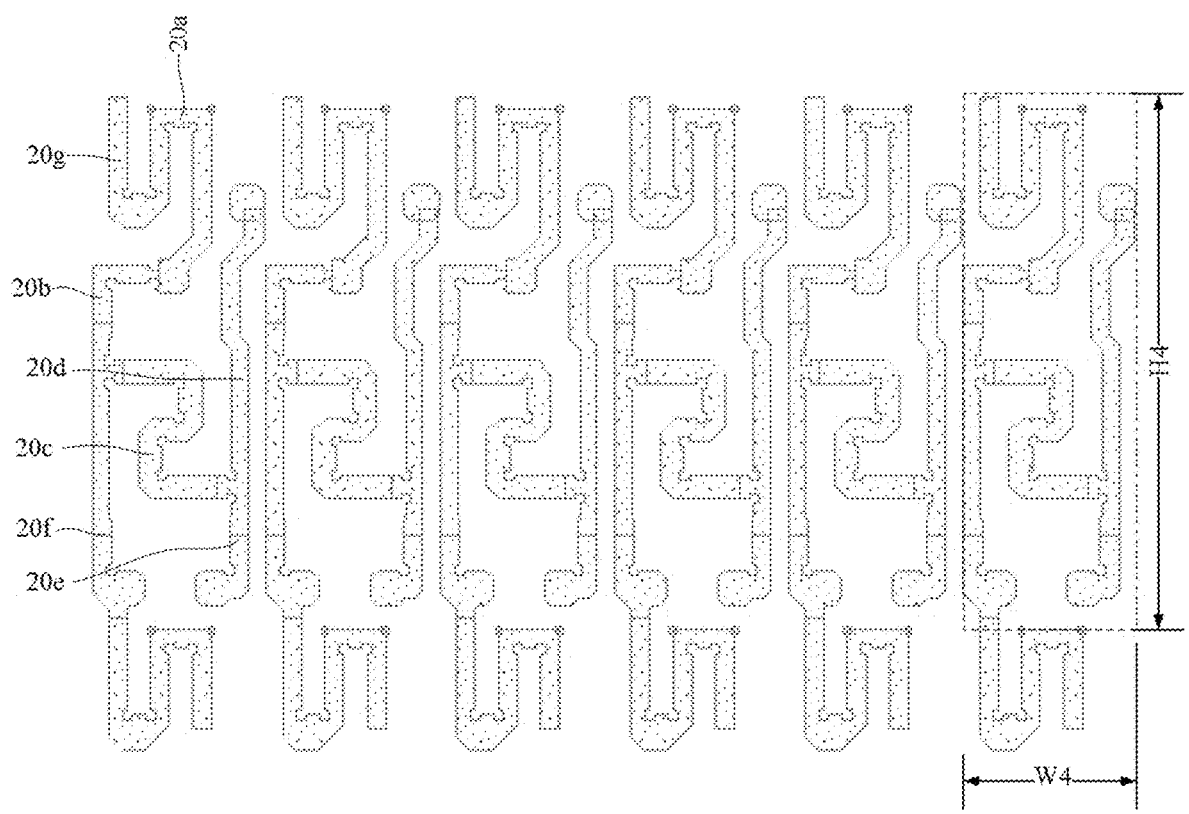
Figure 5:
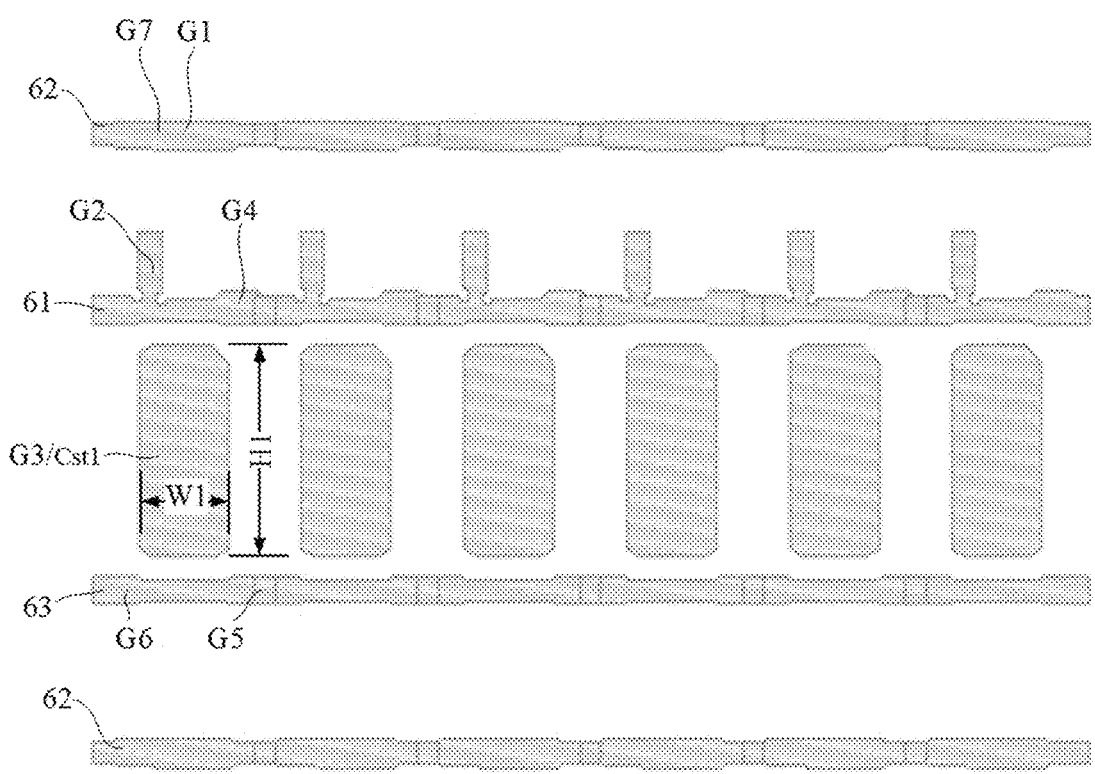
Figure 6:
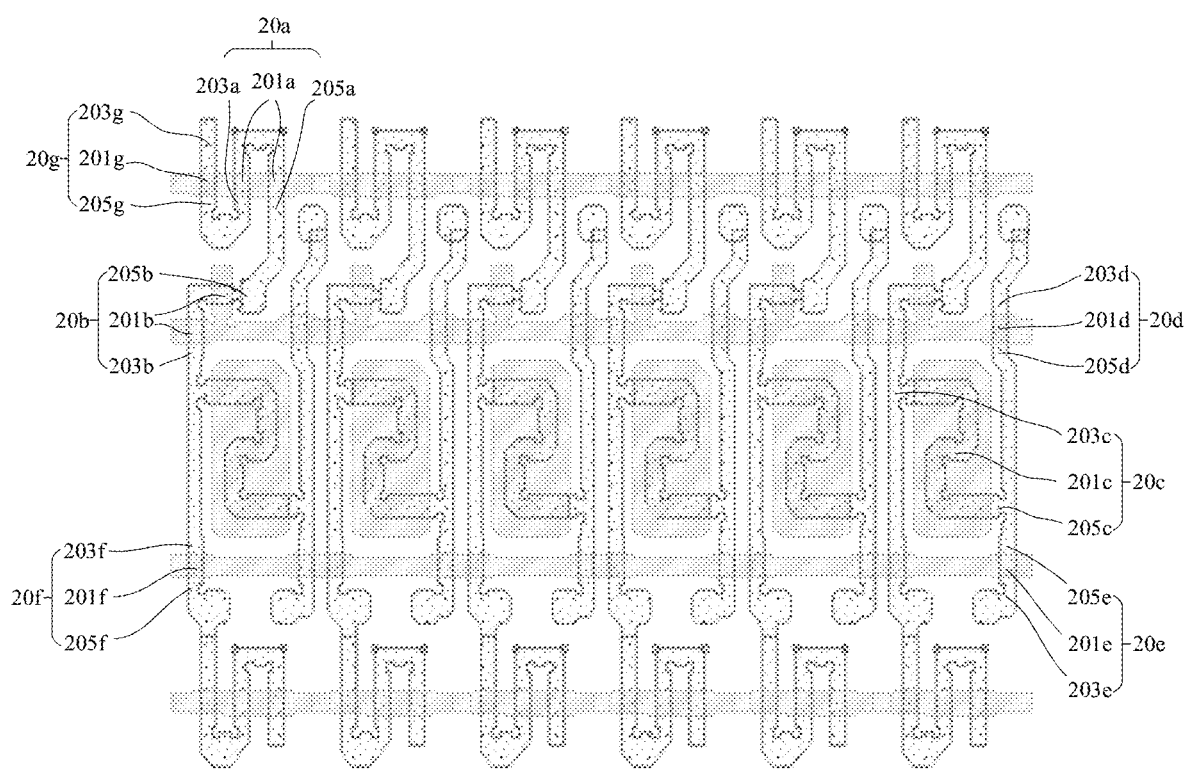
Figure 7A:
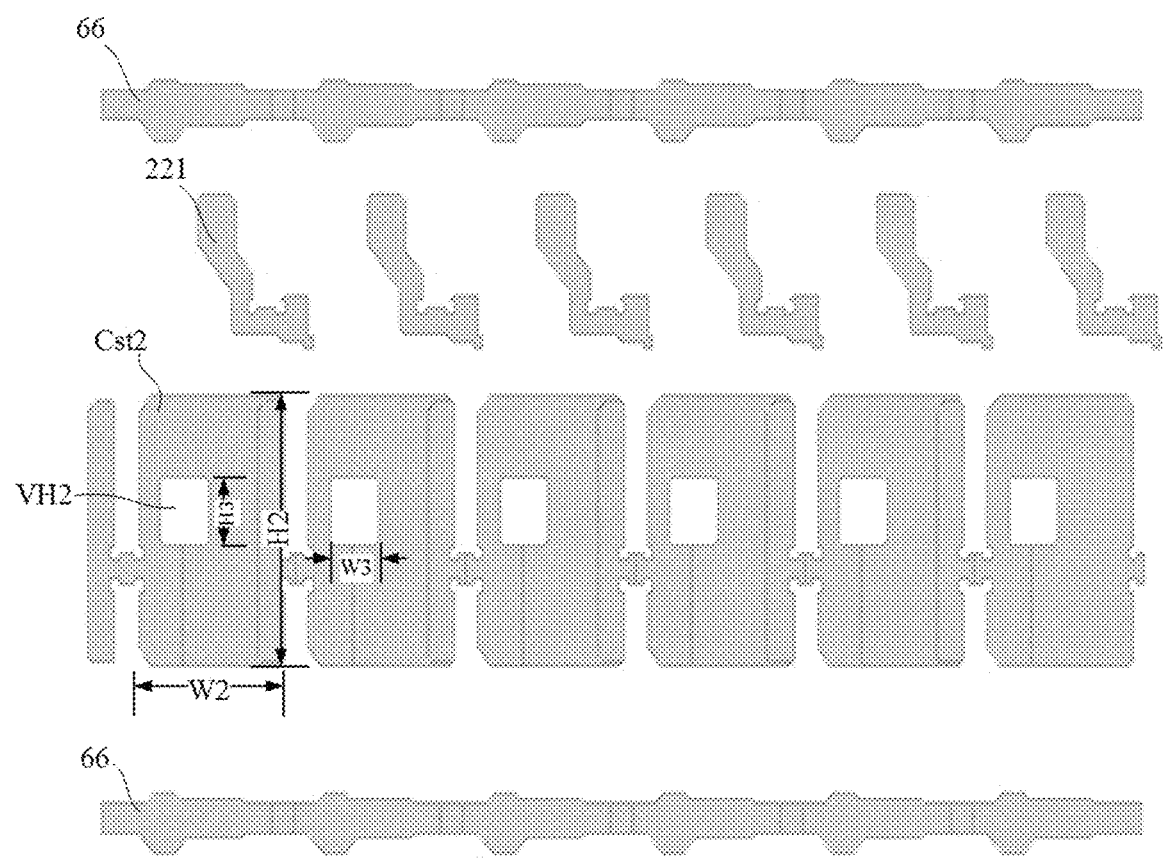
FIG. 7A shows a partial plan view of a second conductive layer included in the display substrate according to embodiments of the present disclosure.
Figure 7B:
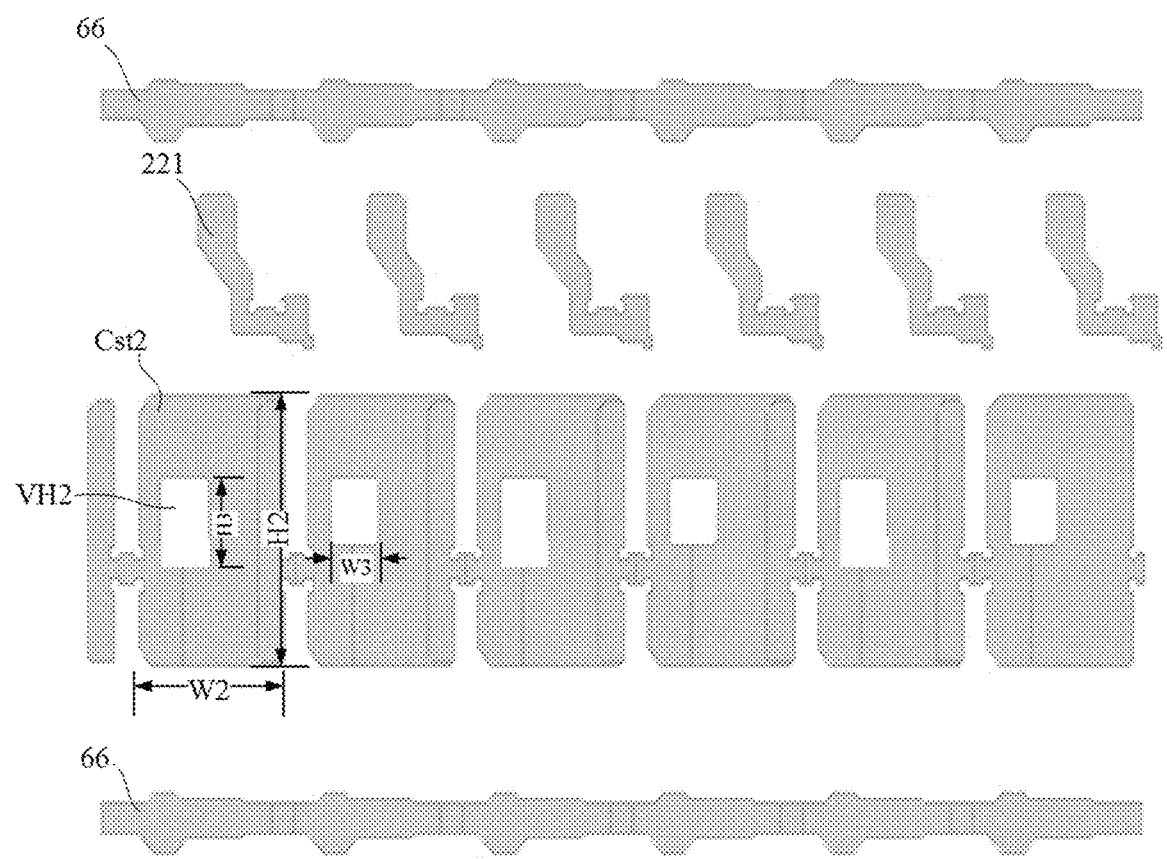
FIG. 7B shows a partial plan view of a second conductive layer included in the display substrate according to other exemplary embodiments of the present disclosure.
Figure 8:
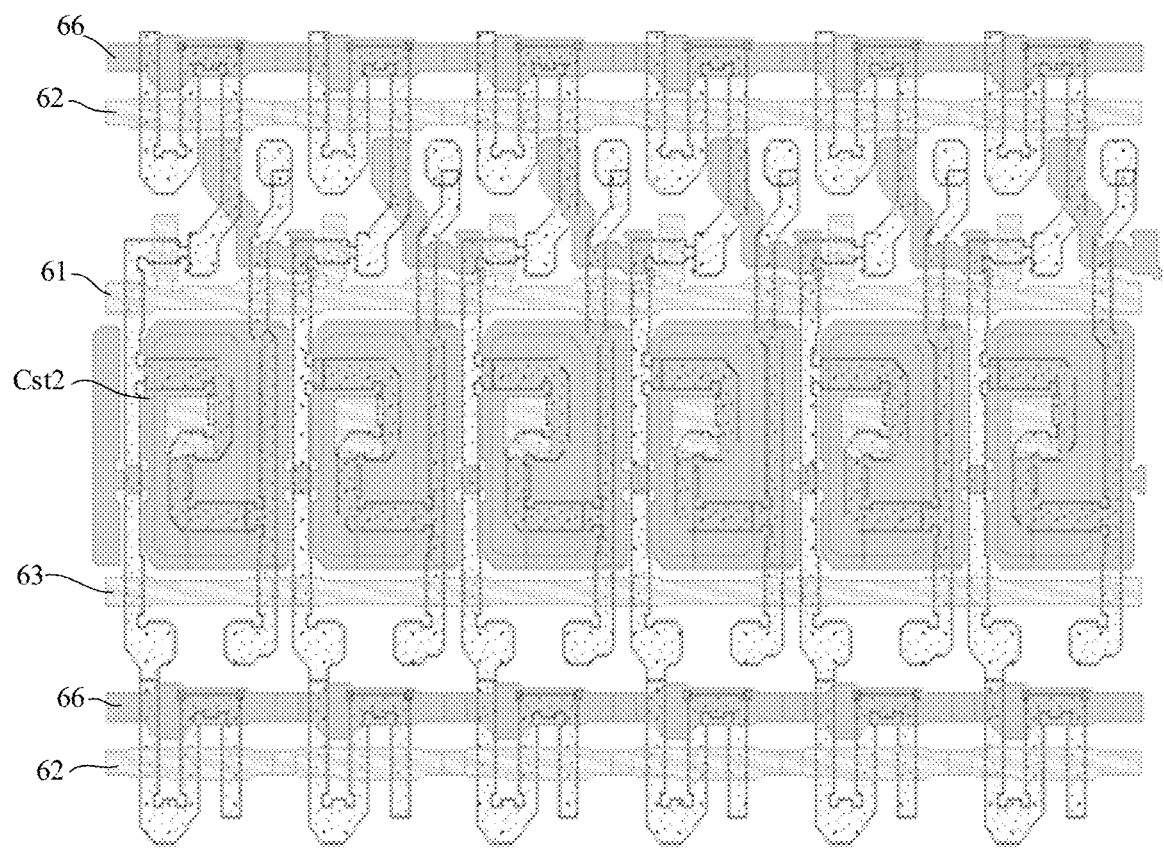
Figure 9:
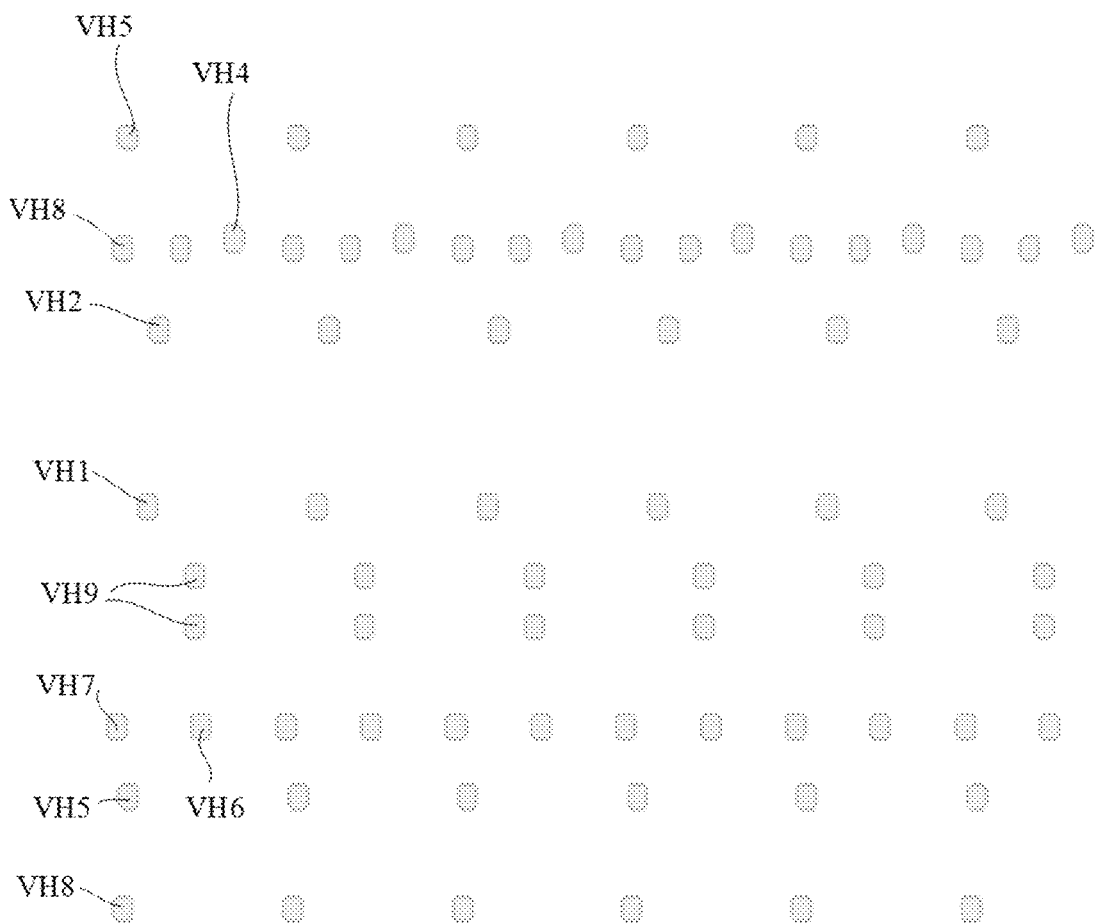
Figure 10:
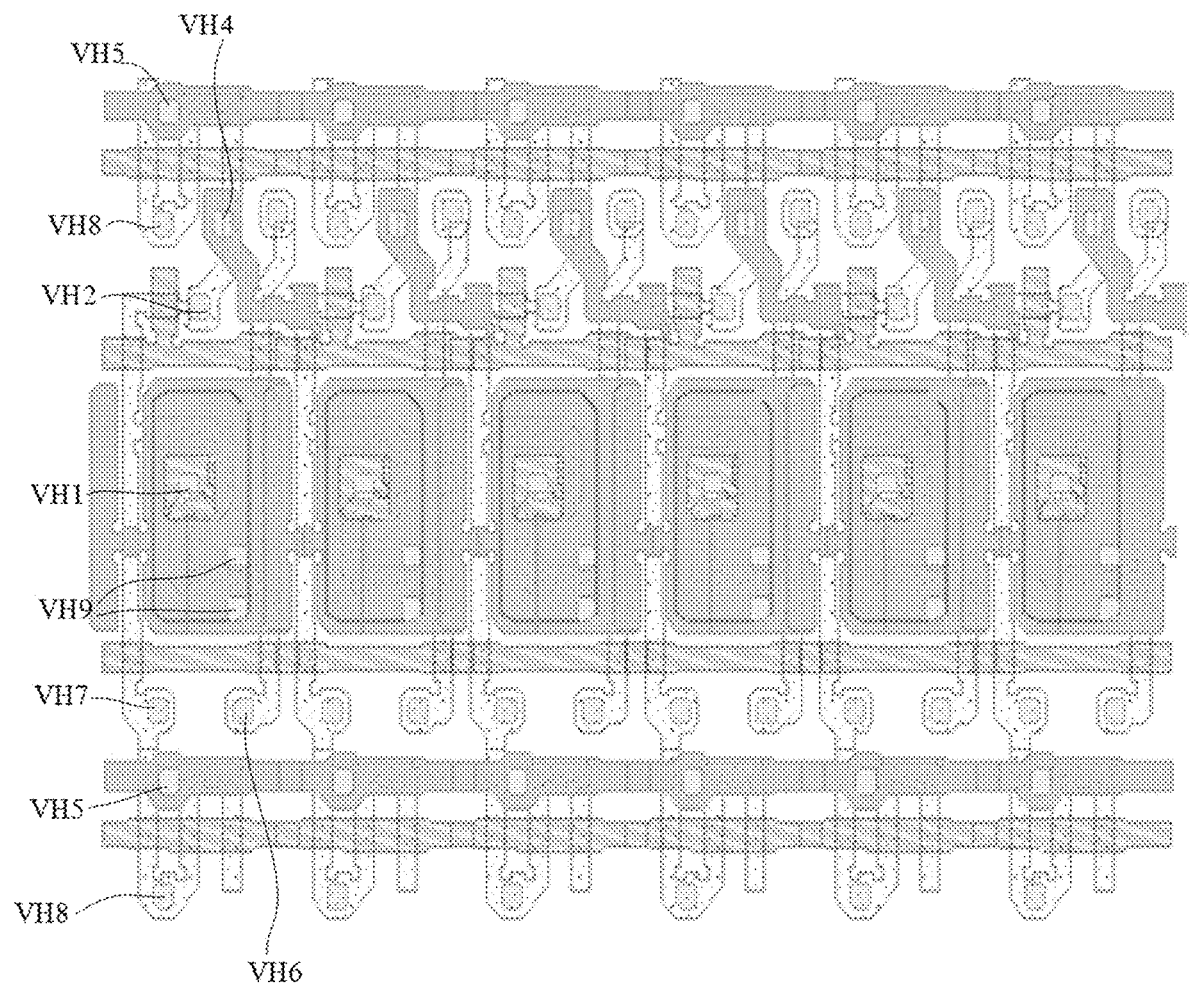
Figure 11:
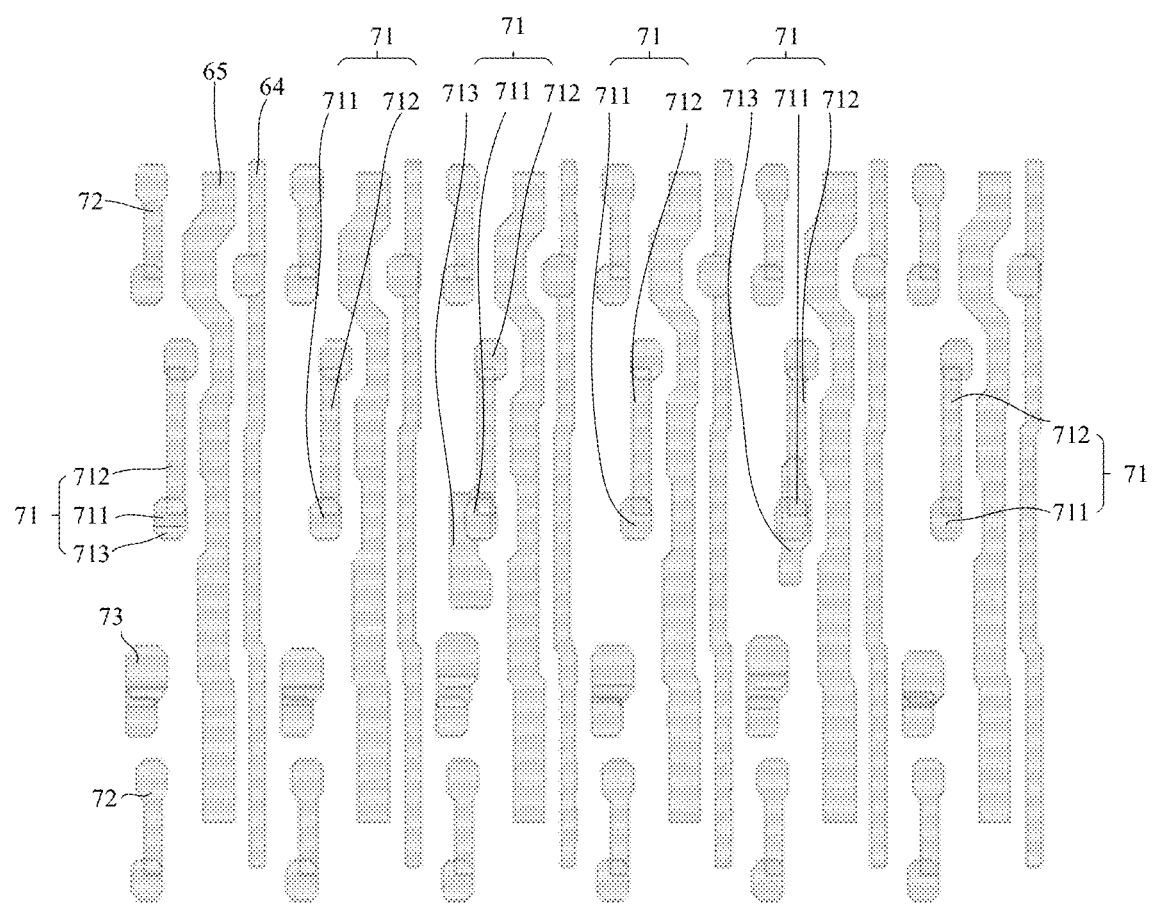
Figure 12:
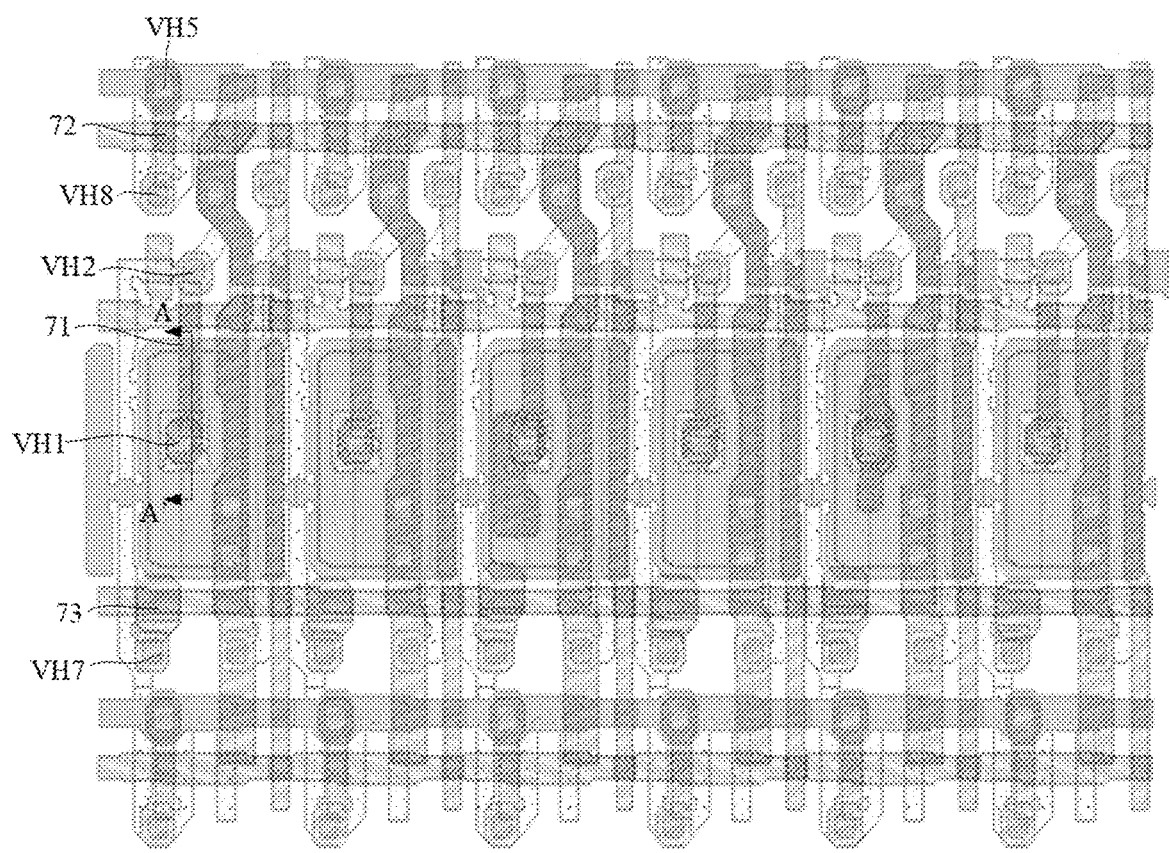
Figure 13:
Figure 14:
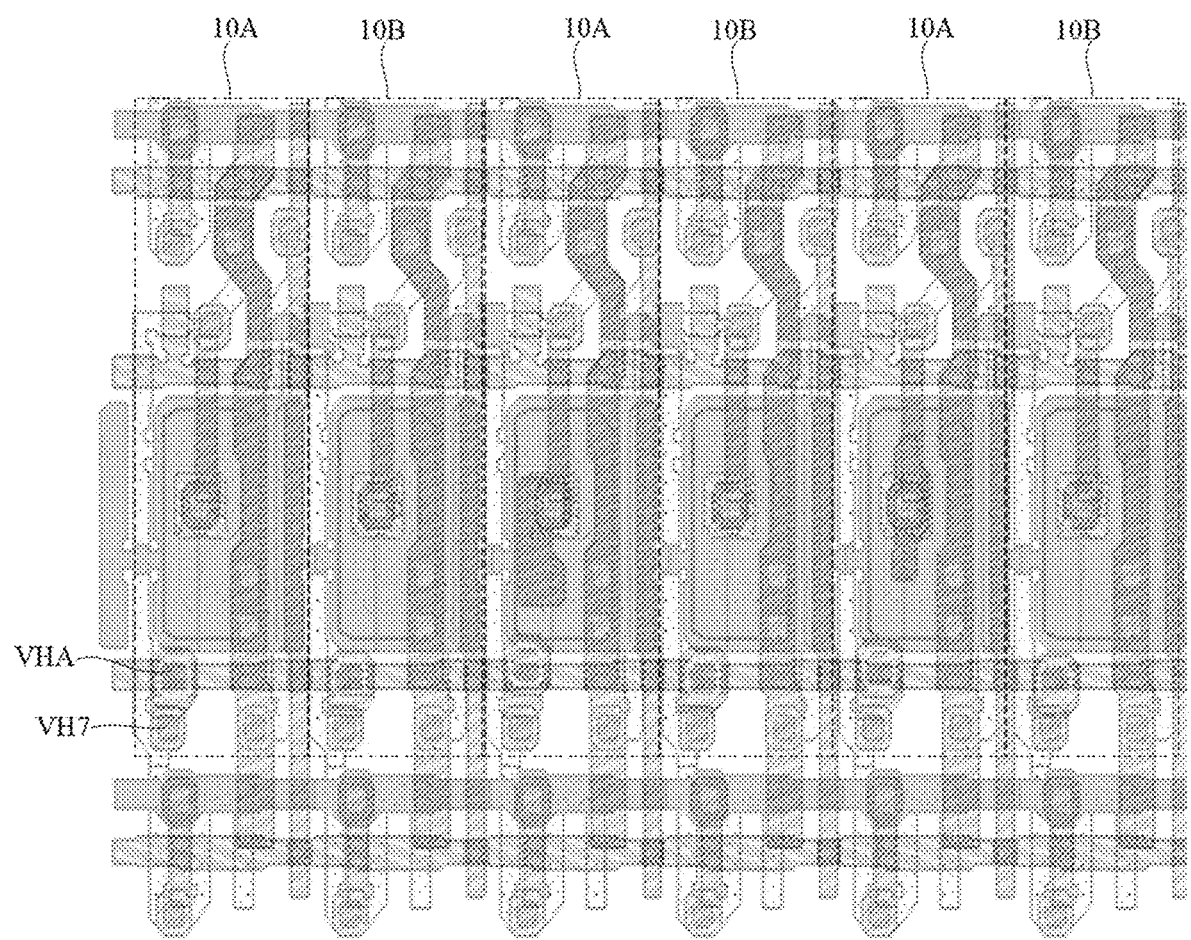
Figure 17:
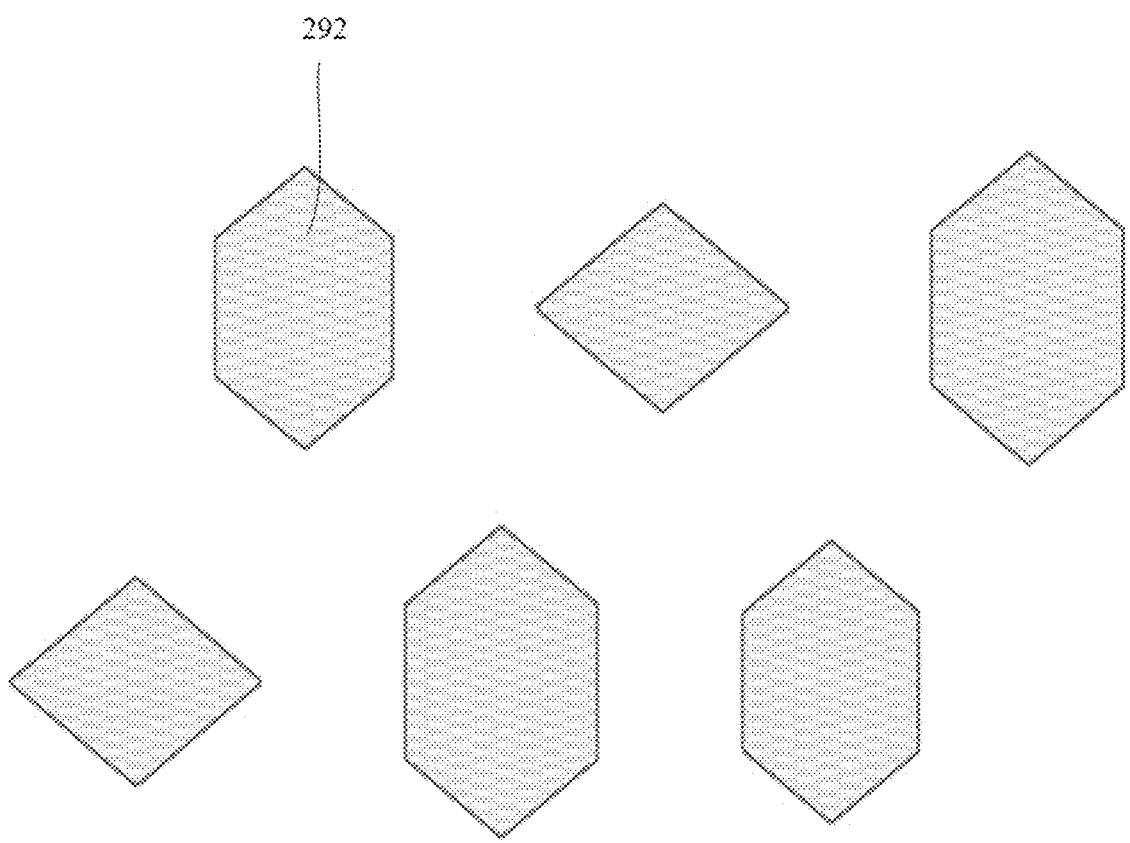
Figure 19:
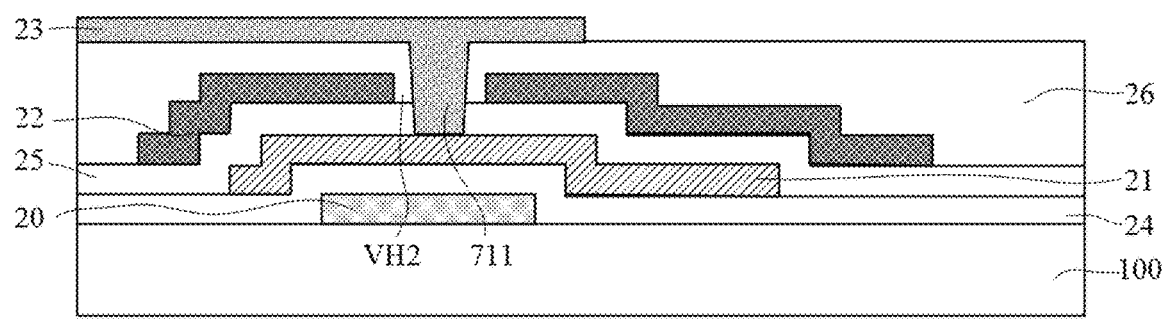
FIG. 19 shows a cross-sectional view of a display substrate according to embodiments of the present disclosure taken along line AA' in FIG. 12.
Figure 20:
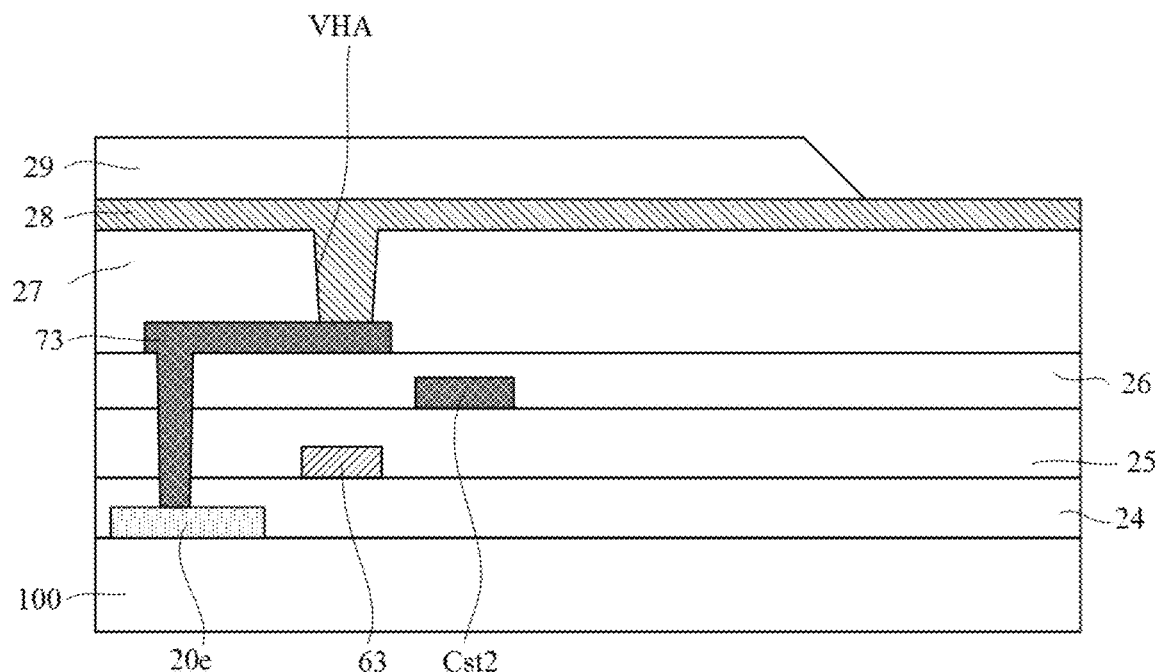
FIG. 20 shows a cross-sectional view of a display substrate according to embodiments of the present disclosure taken along line BB' in FIG. 16.
Figure 21:
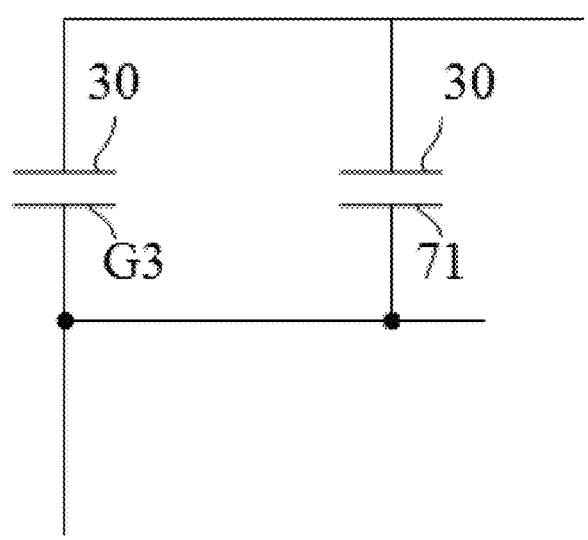
FIG. 21 schematically shows a capacitance between an anode structure and a gate electrode of a driving transistor in a display substrate according to embodiments of the present disclosure.

FIG. 3 shows an equivalent circuit diagram of a pixel driving circuit of a display substrate according to some exemplary embodiments of the present disclosure. FIG. 4 to FIG. 18 are partial plan views of a display substrate according to embodiments of the present disclosure, which schematically show plan views of sub-pixels included in the display substrate, in which: FIG. 4 shows a partial plan view of a semiconductor layer included in the display substrate according to embodiments of the present disclosure, FIG. 5 shows a partial plan view of a first conductive layer included in the display substrate according to embodiments of the present disclosure, FIG. 6 shows a partial plan view of a combination of the semiconductor layer and the first conductive layer included in the display substrate according to embodiments of the present disclosure, FIG. 7A shows a partial plan view of a second conductive layer included in the display substrate according to embodiments of the present disclosure, FIG. 7B shows a partial plan view of a second conductive layer included in the display substrate according to other exemplary embodiments of the present disclosure, FIG. 8 shows a partial plan view of a combination of the semiconductor layer, the first conductive layer and the second conductive layer included in the display substrate according to embodiments of the present disclosure, FIG. 9 shows a partial plan view of a first insulation layer included in the display substrate according to embodiments of the present disclosure, FIG. 10 shows a partial plan view of a combination of the semiconductor layer, the first conductive layer, the second conductive layer and the first insulation layer included in the display substrate according to embodiments of the present disclosure, FIG. 11 shows a partial plan view of a third conductive layer included in the display substrate according to embodiments of the present disclosure, FIG. 12 shows a partial plan view of a combination of the semiconductor layer, the first conductive layer, the second conductive layer, the first insulation layer and the third conductive layer included in the display substrate according to embodiments of the present disclosure, FIG. 13 shows a partial plan view of a second insulation layer included in the display substrate according to embodiments of the present disclosure, FIG. 14 shows a partial plan view of a combination of the semiconductor layer, the first conductive layer, the second conductive layer, the first insulation layer, the third conductive layer and the second insulation layer included in the display substrate according to embodiments of the present disclosure, FIG. 15 shows a partial plan view of a first electrode layer included in the display substrate according to embodiments of the present disclosure, FIG. 16 shows a partial plan view of a combination of the semiconductor layer, the first conductive layer, the second conductive layer, the first insulation layer, the third conductive layer, the second insulation layer and the first electrode layer included in the display substrate according to embodiments of the present disclosure, FIG. 17 shows a partial plan view of a pixel definition layer included in the display substrate according to embodiments of the present disclosure, and FIG. 18 shows a partial plan view of a combination of the semiconductor layer, the first conductive layer, the second conductive layer, the first insulation layer, the third conductive layer, the second insulation layer, the first electrode layer and the pixel definition layer included in the display substrate according to embodiments of the present disclosure. FIG. 19 shows a cross-sectional view of the display substrate according to embodiments of the present disclosure taken along line AA' in FIG. 12. FIG. 20 shows a cross-sectional view of the display substrate according to embodiments of the present disclosure taken along line BB' in FIG. 16. FIG. 21 schematically shows a capacitance between an anode structure and a gate electrode of a driving transistor in the display substrate according to embodiments of the present disclosure.

Referring to FIG. 3 to FIG. 19 in combination, the pixel driving circuit may include a plurality of thin film transistors and a storage capacitor Cst. The pixel driving circuit is used to drive an organic light emitting diode (OLED). The plurality of thin film transistors may include a first transistor T1, a second transistor T2, a third transistor T3, a fourth transistor T4, a fifth transistor T5, a sixth transistor T6, and a seventh transistor T7. Each transistor may include a gate electrode, a source electrode, and a drain electrode.

It should be noted that, unless otherwise specifically stated, the expression "the pixel driving circuit" herein includes a first pixel driving circuit and a second pixel driving circuit.

The display substrate may further include a plurality of signal lines. For example, the plurality of signal lines may include: a scanning signal line 61 for transmitting a scanning signal Sn, a reset signal line 62 for transmitting a reset control signal RESET (that is, a scanning signal for a previous row), a light emission control line 63 for transmitting a light emission control signal En, a data signal line 64 for transmitting a data signal Dm, a driving voltage line 65 for transmitting a driving voltage VDD, an initialization voltage line 66 for transmitting an initialization voltage Vint, and a power line 67 for transmitting a reference voltage VSS.

The first transistor T1, the second transistor T2, the third transistor T3, the fourth transistor T4, the fifth transistor T5, the sixth transistor T6 and the seventh transistor T7 may be formed along an active layer as shown in FIG. 8. The active layer may have a curved or bending shape, and may include a first active layer 20a corresponding to the first transistor T1, a second active layer 20b corresponding to the second transistor T2, a third active layer 20c corresponding to the third transistor T3, a fourth active layer 20d corresponding to the fourth transistor T4, a fifth active layer 20e corresponding to the fifth transistor T5, a sixth active layer 20f corresponding to the sixth transistor T6, and a seventh active layer 20g corresponding to the seventh transistor T7.

The active layer may contain, for example, polysilicon, and may include, for example, a channel region, a source region and a drain region. The channel region may be non-doped or have a doping type different from the source region and the drain region, and therefore has a semiconductor property. The source region and the drain region are respectively located on both sides of the channel region and are doped with impurities, and therefore have conductivity. The impurities may vary depending on whether the TFT is an N-type transistor or a P-type transistor.

It should be noted that for the first insulation layer, the second insulation layer and the pixel definition layer, FIG. 9, FIG. 13 and FIG. 17 schematically show via holes or openings therein, and do not show a main portion of an insulating material layer, which is for the purpose of clearly showing the via holes or openings in the insulation layers.

The first transistor T1 includes the first active layer 20a and a first gate electrode G1. The first active layer 20a may include a first channel region 201a, a first source region 203a, and a first drain region 205a. The gate electrode G1 of the first transistor T1 is electrically connected to the reset signal line 62, a source electrode S1 of the first transistor T1 is electrically connected to the initialization voltage line 66, and a drain electrode D1 of the first transistor T1 is electrically connected to one terminal Cst1 of the storage capacitor Cst, a drain electrode D2 of the second transistor T2 and a gate electrode G3 of the third transistor T3 (the gate electrode G3 may also be referred to as a third electrode herein for ease of description). As shown in FIG. 3, the drain electrode D1 of the first transistor T1, the terminal Cst1 of the storage capacitor Cst, the drain electrode D2 of the second transistor T2 and the gate electrode G3 of the third transistor T3 are electrically connected at a node N1. The first transistor T1 may be turned on according to the reset control signal RESET transmitted through the reset signal line 62, so as to transmit the initialization voltage Vint to the gate electrode G3 of the third transistor T3, so that an initialization operation is performed to initialize a voltage of the gate electrode G3 of the third transistor T3. Accordingly, the first transistor T1 is also referred to as an initialization transistor.

The second transistor T2 includes the second active layer 20b and a second gate electrode G2. The second active layer 20b may include a second channel region 201b, a second source region 203b, and a second drain region 205b. The gate electrode G2 of the second transistor T2 is electrically connected to the scanning signal line 61, a source electrode S2 of the second transistor T2 is electrically connected to a node N3, and the drain electrode D2 of the second transistor T2 is electrically connected to the node N1. The second transistor T2 may be turned on according to the scanning signal Sn transmitted through the scanning signal line 61, so as to electrically connect the gate electrode G3 and a drain electrode D3 of the third transistor T3, so that a diode connection of the third transistor T3 is achieved.

The third transistor T3 includes the third active layer 20c and the gate electrode G3. The third active layer 20c includes a third source region 203c, a third drain region 205c, and a third channel region 201c connecting the third source region 203c and the third drain region 205c. The third source region 203c and the third drain region 205c extend in two opposite directions with respect to the third channel region 201c. The third source region 203c of the third transistor T3 is connected to a fourth drain region 205d and a fifth drain region 205e. The third drain region 205c is connected to the second source region 203b and a sixth source region 203f. The gate electrode G3 of the third transistor T3 is electrically connected to the node N1 through via holes VAH1 and VAH2 and a first connecting portion 71. The gate electrode G3 of the third transistor T3 is electrically connected to the node N1, a source electrode S3 of the third transistor T3 is electrically connected to a node N2, and the drain electrode D3 of the third transistor T3 is electrically connected to the node N3. The third transistor T3 may receive a data signal Dm according to a switching operation of the fourth transistor T4, so as to supply a driving current Id to the OLED. Accordingly, the third transistor T3 is also referred to as a driving transistor.

The fourth transistor T4 includes the fourth active layer 20d and a fourth gate electrode G4. The fourth active layer 20d may include a fourth channel region 201d, a fourth source region 203d, and a fourth drain region 205d. The fourth transistor T4 serves as a switching element for selecting a target light emitting sub-pixel. The fourth gate electrode G4 is connected to the scanning signal line 61, the fourth source region 203d is connected to the data signal line 64 through a via hole VAH4, and the fourth drain region 205d is connected to the first transistor T1 and the fifth transistor T5, that is, electrically connected to the node N2. The fourth transistor T4 may be turned on according to the scanning signal Sn transmitted through the scanning signal line 61, so that a switching operation is performed to transmit the data signal Dm to the source electrode S3 of the third transistor T3.

The fifth transistor T5 includes the fifth active layer 20e and a fifth gate electrode G5. The fifth active layer 20e may include a fifth channel region 201e, a fifth source region 203e, and a fifth drain region 205e. The fifth source region 203e may be connected to the driving voltage line 65 through a via hole VAH6. The gate electrode G5 of the fifth transistor T5 is electrically connected to the light emission control line 63, a source electrode S5 of the fifth transistor T5 is electrically connected to the driving voltage line 65, and a drain electrode D5 of the fifth transistor T5 is electrically connected to the node N2.

The sixth transistor T6 includes the sixth active layer 20f and a sixth gate electrode G6. The sixth active layer 20f may include a sixth channel region 201f, a sixth source region 203f, and a sixth drain region 205f. The sixth drain region 205f may be connected to the anode structure of the OLED through a via hole VAH7. The gate electrode G6 of the sixth transistor T6 is electrically connected to the light emission control line 63, a source electrode S6 of the sixth transistor T6 is electrically connected to the node N3, and a drain electrode D6 of the sixth transistor T6 is electrically connected to the node N4, that is, to the anode structure of the OLED. The fifth transistor T5 and the sixth transistor T6 may be turned on concurrently (for example, simultaneously) according to the light emission control signal En transmitted through the light emission control line 63, so as to transmit the driving voltage VDD to the OLED, thereby allowing the driving current Id to flow into the OLED.

The seventh transistor T7 includes the seventh active layer 20g and a seventh gate electrode G7. The seventh active layer 20g may include a seventh source region 203g, a seventh drain region 205g, and a seventh channel region 201g. The seventh drain region 205g is connected to the first source region 203a of the first transistor T1. The seventh drain region 205g may be electrically connected to the initialization voltage line 66 through a via hole VAH8, a second connecting portion 72 and a via hole VAH5. The gate electrode G7 of the seventh transistor T7 is electrically connected to the reset signal line 62, a source electrode S7 of the seventh transistor T7 is electrically connected to the node N4, and a drain electrode D7 of the seventh transistor T7 is electrically connected to the initialization voltage line 66.

The storage capacitor Cst has one terminal (hereinafter referred to as a first storage capacitor electrode) Cst1 electrically connected to the node N1, and the other terminal (hereinafter referred to as a second storage capacitor electrode) Cst2 electrically connected to the driving voltage line 65.

The OLED has an anode structure electrically connected to the node N4, and a cathode structure electrically connected to the power line 67 to receive the reference voltage VSS. Accordingly, the OLED may receive the driving current Id from the third transistor T3 to emit light, so as to display an image.

It should be noted that in FIG. 3, the thin film transistors T1, T2, T3, T4, T5, T6 and T7 are p-channel field effect transistors, but embodiments of the present disclosure are not limited thereto. At least some of the thin film transistors T1, T2, T3, T4, T5, T6 and T7 may be n-channel field effect transistors.

In operation, in an initialization phase, the reset control signal RESET having a low level is supplied through the reset signal line 62. Then, the first transistor T1 is turned on based on the low level of the reset control signal RESET, and the initialization voltage Vint from the initialization voltage line 66 is transmitted to the gate electrode G1 of the third transistor T3 through the first transistor T1. Accordingly, the third transistor T3 is initialized due to the initialization voltage Vint.

In a data programming phase, the scanning signal Sn having a low level is supplied through the scanning signal line 61. Then, the fourth transistor T4 and the second transistor T2 are turned on based on the low level of the scanning signal Sn. Accordingly, the third transistor T3 is in a diode-connection state and is biased in a forward direction due to the turned-on second transistor T2.

Next, a compensation voltage Dm+Vth (for example, Vth is a negative value) obtained by subtracting a threshold voltage Vth of the third transistor T3 from the data signal Dm supplied via the data signal line 64 is applied to the gate electrode G3 of the third transistor T3. Then, the driving voltage VDD and the compensation voltage Dm+Vth are applied to both terminals of the storage capacitor Cst, so that an electric charge corresponding to a voltage difference between the corresponding terminals is stored in the storage capacitor Cst.

In a light emission phase, the light emission control signal En from the light emission control line 63 changes from being at a high level to being at a low level. Then, in the light emission phase, the fifth transistor T5 and the sixth transistor T6 are turned on based on the low level of the light emission control signal En.

Next, a driving current is generated based on a difference between the voltage of the gate electrode G3 of the third transistor T3 and the driving voltage VDD. The driving current Id corresponding to a difference between the driving current and a bypass current is supplied to the OLED through the sixth transistor T6.

In the light emission phase, based on a current-voltage relationship of the third transistor T3, a gate-source voltage of the third transistor T3 is maintained at (Dm+Vth)−VDD due to the storage capacitor Cst. The driving current Id is proportional to $(Dm-VDD)^2$. Therefore, the driving current Id may not be affected by a change of the threshold voltage Vth of the third transistor T3.

Referring to FIG. 4 to FIG. 21 in combination, the display substrate includes a base substrate 100 and a plurality of film layers on the base substrate 100. In some embodiments, the plurality of film layers include at least a semiconductor layer 20, a first conductive layer 21, a second conductive layer 22, and a third conductive layer 23 that are sequentially arranged away from the base substrate 100. The plurality of film layers may further include at least a plurality of insulation film layers, for example, the plurality of insulation film layers may include a first gate insulation layer 24, a second gate insulation layer 25 and a first insulation layer 26. The first gate insulation layer 24 may be arranged between the semiconductor layer 20 and the first conductive layer 21, the second gate insulation layer 25 may be arranged between the first conductive layer 21 and the second conductive layer 22, and the first insulation layer 26 may be arranged between the second conductive layer 22 and the third conductive layer 23.

For example, the semiconductor layer 20 may be made of a semiconductor material such as low-temperature polysilicon, and may have a film layer thickness in a range from 400 angstroms to 800 angstroms, such as 500 angstroms. The first conductive layer 21 and the second conductive layer 22 may be made of a conductive material that forms the gate electrode of the thin film transistor. For example, the conductive material may be Mo. The first conductive layer 21 and the second conductive layer 22 may have a film layer thickness in a range from 2000 angstroms to 4000 angstroms, such as 3000 angstroms. The third conductive layer 23 may be made of a conductive material that forms the source electrode and the drain electrode of the thin film transistor. For example, the conductive material may contain Ti, Al, etc. The third conductive layer 23 may have a stacked structure formed of Ti/Al/Ti, and have a film layer thickness in a range from 6000 angstroms to 9000 angstroms. For example, the third conductive layer 23 has the stacked structure formed of Ti/Al/Ti, the layers of Ti/Al/Ti may have thicknesses of about 500 angstroms, 6000 angstroms and 500 angstroms, respectively. For example, the first gate insulation layer 24 and the second gate insulation layer 25 may be made of silicon oxide, silicon nitride or silicon oxynitride, and each layer may have a thickness in a range of about 1000 angstroms to 2000 angstroms. For example, the first insulation layer 26 may be made of silicon oxide, silicon nitride or silicon oxynitride, and may have a thickness in a range of about 3000 angstroms to 6000 angstroms.

The display substrate includes the scanning signal line 61, the reset signal line 62, the light emission control line 63 and the initialization voltage line 66 that are arranged in the row direction and used to respectively apply the scanning signal Sn, the reset control signal RESET, the light emission control signal En and the initialization voltage Vint to the sub-pixels SP1, SP2 and SP3. The display substrate may further include the data signal line 64 and the driving voltage line 65 that cross the scanning signal line 61, the reset signal line 62, the light emission control line 63 and the initialization voltage line 66 and used to respectively apply the data signal Dm and the driving voltage VDD to the sub-pixels SP1, SP2 and SP3.

As shown in FIG. 5 and FIG. 6, the scanning signal line 61, the reset signal line 62 and the light emission control line 63 are located in the first conductive layer 21. The gate electrodes G1 to G7 of the above-mentioned transistors are also located in the first conductive layer 21. For example, a portion of the reset signal line 62 that overlaps the semiconductor layer 20 forms the gate electrode G1 of the first transistor T1 and the gate electrode G7 of the seventh transistor T7 respectively, a portion of the scanning signal line 61 that overlaps the semiconductor layer 20 forms the gate electrode G2 of the second transistor T2 and the gate electrode G4 of the fourth transistor T4 respectively, and a portion of the light emission control line 63 that overlaps the semiconductor layer 20 forms the gate electrode G6 of the sixth transistor T6 and the gate electrode G5 of the fifth transistor T5 respectively.

Continuing to refer to FIG. 5 and FIG. 6, the display substrate may further include a plurality of first storage capacitor electrodes Cst1, and the plurality of first storage capacitor electrodes Cst1 are also located in the first conductive layer 21. A portion of the first storage capacitor electrode Cst1 that overlaps the semiconductor layer 20 forms the gate electrode G3 of the third transistor T3. The first storage capacitor electrode Cst1 also forms one terminal of the storage capacitor Cst. That is, the first storage capacitor electrode Cst1 serves as both the gate electrode G3 of the third transistor T3 and an electrode of the storage capacitor Cst.

The first storage capacitor electrode Cst1 has a first size W1 in the first direction X and a second size H1 in the second direction Y. For example, a shape of an orthographic projection of the first storage capacitor electrode Cst1 on the base substrate 100 may be substantially a rectangle. The "substantially a rectangle" herein may include a rectangle, a rectangle with at least one rounded corner, a rectangle with at least one chamfered corner, or the like. With reference to FIG. 5, the first size W1 may represent a width of the first storage capacitor electrode Cst1, and the second size H1 may represent a height of the first storage capacitor electrode Cst1.

As shown in FIG. 7A and FIG. 8, the initialization voltage line 66 is located in the second conductive layer 22. The display substrate may further include a plurality of second storage capacitor electrodes Cst2, and the plurality of second storage capacitor electrodes Cst2 are also located in the second conductive layer 22. The plurality of second storage capacitor electrodes Cst2 are arranged corresponding to the plurality of first storage capacitor electrodes Cst1 respectively. That is, an orthographic projection of the plurality of second storage capacitor electrodes Cst2 on the base substrate 100 at least partially overlaps an orthographic projection of the corresponding first storage capacitor electrodes Cst1 on the base substrate 100. The second storage capacitor electrode Cst2 forms the other terminal of the storage capacitor Cst. That is, the first storage capacitor electrode Cst1 and the second storage capacitor electrode Cst2 are arranged opposite to each other, the orthographic projections of the two on the base substrate 100 overlap at least partially with each other, and the second gate insulation layer 25 is arranged between the two. For example, the first storage capacitor electrode Cst1 may be electrically connected to the node N1 through the via holes VAH1 and VAH2 and the first connecting portion 71, and the second storage capacitor electrode Cst2 may be electrically connected to the driving voltage line 65 through a via hole VAH9, that is, the two are connected to different voltage signals. In this way, an overlapping portion of the first storage capacitor electrode Cst1 and the second storage capacitor electrode Cst2 may form the storage capacitor Cst.

The second storage capacitor electrode Cst2 has a first size W2 in the first direction X and a second size H2 in the second direction Y.

Referring to FIG. 7A, FIG. 12 and FIG. 20 in combination, the second storage capacitor electrode Cst2 may include the via hole VH2 to facilitate an electrical connection between the first storage capacitor electrode Cst1 located below the second storage capacitor electrode Cst2 and a component located in the third conductive layer 23. For example, a part of the first connecting portion 71 is formed in the via hole VAH1 to form a conductive plug 711. The conductive plug 711 extends through the via hole VH2 and is electrically connected to the first storage capacitor electrode Cst1. In this way, one end of the first connecting portion 71 is electrically connected to the terminal Cst1 of the storage capacitor.

The via hole VH2 of the second storage capacitor electrode Cst2 has a first size W3 in the first direction X and a second size H3 in the second direction Y. For example, a shape of an orthographic projection of the via hole VH2 on the base substrate 100 may be substantially a rectangle. The "substantially a rectangle" herein may include a rectangle or a square, a rectangle or a square with at least one rounded corner, a rectangle or a square with at least one chamfered corner, or the like. With reference to FIG. 7A, the first size W3 may represent a width of the via hole VH2, and the second size H3 may represent a height of the via hole VH2.

Referring to FIG. 11, the data signal line 64 and the driving voltage line 65 are located in the third conductive layer 23. In addition, the first connecting portion 71, the second connecting portion 72 and a third connecting portion 73 are also located in the third conductive layer 23. The data signal line 64, the driving voltage line 65 and the first connecting portion 71 extend in the second direction Y.

The display substrate may further include a plurality of film layers on the base substrate 100. In some embodiments, the plurality of film layers include at least a second insulation layer 27, a first electrode layer 28 and a pixel definition layer 29. The first electrode layer 28 may be arranged on a side of the third conductive layer 23 away from the base substrate, the second insulation layer 27 may be arranged between the third conductive layer 23 and the first electrode layer 28, and the pixel definition layer 29 may be arranged on a side of the first electrode layer 28 away from the base substrate to define a plurality of openings 292 (referring to FIG. 17).

Referring to FIG. 15 and FIG. 16, the display substrate includes a plurality of anode structures 30 in the first electrode layer 28. Each sub-pixel includes one anode structure 30. The anode structure 30 is electrically connected to the lower pixel driving circuit through the anode connection hole VHA. Specifically, the anode structure 30 is electrically connected to one end of the third connecting portion 73 through the anode connection hole VHA, and the other end of the third connecting portion 73 is electrically connected to the sixth drain region 205f of the sixth transistor T6 through the via hole VAH7. In this way, the anode structure 30 may be electrically connected to the drain electrode of the sixth transistor T6.

Referring to FIG. 7A to FIG. 14 in combination, the display substrate further includes a shielding portion 221 in the second conductive layer. The driving voltage line 65 includes a bending portion 651 that bends in a direction away from the data signal line 64 adjacent to the driving voltage line. An orthographic projection of the bending portion 651 of the driving voltage line on the base substrate at least partially overlaps an orthographic projection of the shielding portion 221 on the base substrate. For example, the driving voltage line 65 is electrically connected to the lower shielding portion 221 through a via hole VH4 at the bending portion 651 of the driving voltage line. In such embodiments, the driving voltage line 65 includes a bending segment, and the bending segment overlaps the lower shielding portion, which is not only conducive to an electrical connection between the driving voltage line 65 and the lower shielding portion 221, but also conducive to improving a transmission of the display substrate.

As described above, in embodiments of the present disclosure, the plurality of sub-pixels are divided into two types according to the relative positional relationship between the anode structure of the sub-pixel and the lower pixel driving circuit. The first-type sub-pixel C1 includes a first pixel driving circuit and a first light emitting device. The first pixel driving circuit is electrically connected to the first light emitting device to drive the first light emitting device to emit light. The second-type sub-pixel C2 includes a second pixel driving circuit and a second light emitting device. The second pixel driving circuit is electrically connected to the second light emitting device to drive the second light emitting device to emit light. For the convenience of description, the first pixel driving circuit and the second pixel driving circuit are denoted by 10A and 10B respectively, the first light emitting device and the second light emitting device are denoted by 20A and 20B respectively, and the first anode structure and the second anode structure are denoted by 30A and 30B respectively.

The first-type sub-pixel C1 includes a first pixel driving circuit 10A and a first light emitting device 20A. The first pixel driving circuit 10A is electrically connected to the first light emitting device 20A to drive the first light emitting device 20A to emit light. The second-type sub-pixel C2 includes a second pixel driving circuit 10B and a second light emitting device 20B. The second pixel driving circuit 10B is electrically connected to the second light emitting device 20B to drive the second light emitting device 20B to emit light.

An orthographic projection of the first pixel driving circuit 10A on the base substrate 100 and an orthographic projection of the second pixel driving circuit 10B on the base substrate 100 are arranged side by side in a same row in the first direction X. For example, for adjacent odd-numbered row of sub-pixels PL1 and even-numbered row of sub-pixels PL2, the odd-numbered row of sub-pixels PL1 includes a plurality of first-type sub-pixels C1 arranged in the first direction X, and the even-numbered row of sub-pixels PL2 includes a plurality of second-type sub-pixels C2 arranged in the first direction X. A plurality of first pixel driving circuits 10A of the odd-numbered row of sub-pixels PL1 and a plurality of second pixel driving circuits 10B of the even-numbered row of sub-pixels PL2 are arranged side by side in the same row in the first direction X.

The first light emitting device 20A includes a first anode structure 30A, and the second light emitting device 20B includes a second anode structure 30B. An orthographic projection of the first anode structure 30A on the base substrate 100 and an orthographic projection of the second anode structure 30B on the base substrate 100 are arranged in different rows. For example, the first anode structure 30A and the second anode structure 30B are alternately arranged in the first direction X.

The orthographic projection of the first anode structure 30A on the base substrate 100 at least partially overlaps an orthographic projection of an occupation region of the first pixel driving circuit 10A on the base substrate 100, so as to form a first overlapping region OV1. The orthographic projection of the second anode structure 30B on the base substrate 100 at least partially overlaps an orthographic projection of an occupation region of the second pixel driving circuit 10B on the base substrate 100, so as to form a second overlapping region OV2. In embodiments of the present disclosure, an area of the first overlapping region OV1 is less than that of the second overlapping region OV2.

It should be noted that herein, the expression "occupation region" refers to a maximum region covered by an orthographic projection of a pattern, a layer structure, etc. on the base substrate. Specifically, the orthographic projection of the a pattern, the layer structure, etc. on the base substrate has two sides farthest away from each other in the first direction X and two sides farthest away from each other in the second direction Y. Extension lines of these four sides may cross to surround a region, which is the occupation region of the pattern, the layer structure, etc. For example, referring to FIG. 4, for the pixel driving circuit of a sub-pixel, a shape of the occupation region of the active layer is a rectangle or substantially a rectangle. As shown in FIG. 4, the occupation region of the active layer of a sub-pixel is schematically shown with a dashed box, which has a size (i.e., a width W4) in the first direction X and a size (i.e., a length H4) in the second direction Y. The length H4 is greater than the width W4, or the length H4 is 1.2 times or above the width W4, that is, a shape of the occupation region is a rectangle. Herein, unless otherwise specified, the occupation region of the active layer of the pixel driving circuit of a sub-pixel may be used to represent the occupation region of the pixel driving circuit.

Referring to FIG. 16, the orthographic projection of the second anode structure 30B on the base substrate 100 overlaps most of the orthographic projection of the occupation region of the second pixel driving circuit 10B on the base substrate 100, and the orthographic projection of the first anode structure 30A on the base substrate 100 overlaps only a small part of the orthographic projection of the occupation region of the first pixel driving circuit 10A on the base substrate 100. For example, the orthographic projection of the first anode structure 30A on the base substrate 100 mainly overlaps an orthographic projection of the initialization voltage line 66 and the reset signal line 62 of a next row of sub-pixels on the base substrate 100. That is, a region where the first anode structure 30A of the first-type sub-pixel C1 is located and a region where the second anode structure 30B of the second-type sub-pixel C2 is located have different "topographies".

Referring to FIG. 3 and FIG. 16 in combination, in each sub-pixel, the anode structure and the gate electrode G3 of the lower third transistor T3 overlap each other, so that a parasitic capacitance may be generated between the two. That is, a capacitive load may exist between the node N4 and the node N1. As the region where the first anode structure 30A of the first-type sub-pixel C1 is located and the region where the second anode structure 30B of the second-type sub-pixel C2 is located have different "topographies", capacitive loads between the nodes N4 and the nodes N1 are different, which may lead to brightness non-uniformity.

In embodiments of the present disclosure, one end of the first connecting portion 71 is electrically connected to the gate electrode G3 of the third transistor T3, and the gate electrode G3 of the third transistor T3 and the first connecting portion 71 constitute a driving gate conductive portion. Each of the first pixel driving circuit 10A and the second pixel driving circuit 10B includes a driving gate conductive portion, and each of the driving gate conductive portion of the first pixel driving circuit 10A and the driving gate conductive portion of the second pixel driving circuit 10B includes a gate electrode G3 of a third transistor T3 and a first connecting portion 71. The orthographic projection of the first anode structure 30A on the base substrate 100 at least partially overlaps the orthographic projection of the driving gate conductive portion of the first pixel driving circuit 10A on the base substrate 100, so as to form a third overlapping region OV3. The orthographic projection of the second anode structure 30B on the base substrate 100 at least partially overlaps the orthographic projection of the driving gate conductive portion of the second pixel driving circuit 10B on the base substrate 100, so as to form a fourth overlapping region OV4.

In embodiments of the present disclosure, a ratio of an area of the third overlapping region OV3 to an area of the fourth overlapping region OV4 is in a range from 0.8 to 1.2, for example, in a range from 0.85 to 1.15, in a range from 0.9 to 1.1, or the area of the third overlapping region OV3 is substantially equal to the area of the fourth overlapping region OV4.

In embodiments of the present disclosure, the first connecting portion 71 in the third conductive layer 23 is electrically connected to the gate electrode G3 of the third transistor T3. With the design of the first connecting portion 71, an overlapping area of the whole of the first connecting portion 71 and the gate electrode G3 of the third transistor T3 with the upper anode structure is substantially the same in the two types of sub-pixels, so that the capacitive loads between the nodes N4 and the nodes N1 are substantially the same, and the phenomenon of brightness non-uniformity may be at least mitigated or eliminated.

In embodiments of the present disclosure, the region where the first anode structure 30A of the first-type sub-pixel C1 is located and the region where the second anode structure 30B of the second-type sub-pixel C2 is located have different "topographies". By increasing the area of the driving gate conductive portion of the first pixel driving circuit 10A of the first-type sub-pixel C1, the overlapping area between the driving gate conductive portion of the first pixel driving circuit 10A and the first anode structure 30A of the first-type sub-pixel C1 is substantially equal to the overlapping area between the driving gate conductive portion of the second pixel driving circuit 10B and the second anode structure 30B of the second-type sub-pixel C2.

Referring to FIG. 5, a ratio of an area of an orthographic projection of the gate electrode G3 of the first pixel driving circuit 10A on the base substrate 100 to an area of an orthographic projection of the gate electrode G3 of the second pixel driving circuit 10B on the base substrate 100 is in a range from 0.8 to 1.2, for example, in a range from 0.85 to 1.15, in a range from 0.9 to 1.1, or the area of the orthographic projection of the gate electrode G3 of the first pixel driving circuit 10A on the base substrate 100 is substantially equal to the area of the orthographic projection of the gate electrode G3 of the second pixel driving circuit 10B on the base substrate 100.

Referring to FIG. 5, FIG. 11 and FIG. 12, an area of an orthographic projection of the driving gate conductive portion of the first pixel driving circuit 10A on the base substrate 100 is greater than an area of an orthographic projection of the driving gate conductive portion of the second pixel driving circuit 10B on the base substrate 100. For example, an area of an orthographic projection of the first connecting portion 71 of the first pixel driving circuit 10A on the base substrate 100 is greater than an area of an orthographic projection of the first connecting portion 71 of the second pixel driving circuit 10B on the base substrate 100. In embodiments of the present disclosure, the area of the driving gate conductive portion of the first pixel driving circuit 10A of the first-type sub-pixel C1 is increased by increasing the area of the first connecting portion 71 electrically connected to the gate electrode G3 of the third transistor T3.

Referring to FIG. 11, as described above, a part of the first connecting portion 71 is formed in the via hole VAH1 to form the conductive plug 711, that is, the first connecting portion 71 includes the conductive plug 711. For the first-type sub-pixel C1 and the second-type sub-pixel C2, the first connecting portion 71 further includes a first connecting sub-portion 712. For example, the first connecting sub-portion 712 extends upward from the conductive plug 711, so that the other end of the first connecting portion 71 is electrically connected to the via hole VAH2. The first connecting sub-portion 712 and the conductive plug 711 are formed as an integral structure. Further, for the first-type sub-pixel C1, the first connecting portion 71 further includes a second connecting sub-portion 713. The first connecting sub-portion 712, the conductive plug 711 and the second connecting sub-portion 713 are formed as an integral structure. An orthographic projection of the first connecting sub-portion 712 on the base substrate 100 and an orthographic projection of the second connecting sub-portion 713 on the base substrate 100 are located on opposite sides of an orthographic projection of the via hole VH2 or the conductive plug 711 on the base substrate 100. That is, in the illustrated embodiments, the first connecting sub-portion 712 extends upward from the conductive plug 711, and the second connecting sub-portion 713 extends downward from the conductive plug 711. In embodiments of the present disclosure, the first connecting portion 71 of the first-type sub-pixel C1 includes an additional second connecting sub-portion 713, so that the area of the driving gate conductive portion of the first pixel driving circuit 10A of the first-type sub-pixel C1 may be increased.

Referring to FIG. 15 and FIG. 16, the first anode structure 30A includes an anode body portion 31A and an anode extension portion 32A, and the anode extension portion 32A extends from the anode body portion 31A to the first pixel driving circuit 10A. Each of the orthographic projection of the gate electrode G3 of the first pixel driving circuit 10A on the base substrate 100 and the orthographic projection of the first connecting portion 71 of the first pixel driving circuit 10A on the base substrate 100 at least partially overlaps an orthographic projection of the anode extension portion 32A of the first anode structure on the base substrate 100, so as to form the third overlapping region OV3.

For example, the anode extension portion 32A of the first anode structure of the plurality of first-type sub-pixels C1 in the $(n+1)^{th}$ row of sub-pixels PL1 is located between the second anode structures 30B of two second-type sub-pixels C2 in the $n^{th}$ row of sub-pixels PL2 in the first direction X.

Each of the orthographic projection of the gate electrode G3 of the first pixel driving circuit 10A on the base substrate 100 and the orthographic projection of the first connecting portion 71 of the first pixel driving circuit 10A on the base substrate 100 is spaced apart from an orthographic projection of the anode body portion 31A of the first anode structure 30A on the base substrate 100. Each of the orthographic projection of the gate electrode G3 of the first pixel driving circuit 10A on the base substrate 100 and the orthographic projection of the first connecting portion 71 of the first pixel driving circuit 10A on the base substrate 100 does not overlap the orthographic projection of the anode body portion 31A of the first anode structure 30A on the base substrate 100.

The second anode structure 30B includes an anode body portion 31B. Each of the orthographic projection of the gate electrode G3 of the second pixel driving circuit 10B on the base substrate 100 and the orthographic projection of the first connecting portion 71 of the second pixel driving circuit 10B on the base substrate 100 at least partially overlaps an orthographic projection of the anode body portion 31B of the second anode structure on the base substrate 100, so as to form the fourth overlapping region OV4.

In embodiments of the present disclosure, the driving gate conductive portion is formed as one terminal of the storage capacitor, that is, a combination of the first storage capacitor electrode (i.e., the gate electrode G3 of the third transistor T3) Cst1 and the first connecting portion 71 is formed as one terminal of the storage capacitor. As described above, an area of the orthographic projection of the driving gate conductive portion of the first pixel driving circuit 10A on the base substrate 100 is greater than an area of the orthographic projection of the driving gate conductive portion of the second pixel driving circuit 10B on the base substrate 100. In order to ensure that storage capacitances of the sub-pixels have substantially the same value, embodiments of the present disclosure may be implemented to reduce an area of the second storage capacitor electrode Cst2 in the first pixel driving circuit 10A. That is, an area of an orthographic projection of the second storage capacitor electrode Cst2 of the first pixel driving circuit 10A on the base substrate 100 is less than an area of an orthographic projection of the second storage capacitor electrode Cst2 of the second pixel driving circuit 10B on the base substrate 100.

Referring to FIG. 15, a width of the anode extension portion 32A of the first anode structure in the first direction X is less than a width of the anode body portion 31A of the first anode structure in the first direction X.

In the adjacent $(n+1)^{th}$ row of sub-pixels PL1 and $n^{th}$ row of sub-pixels PL2, the anode connection hole VHA of the first-type sub-pixel C1 and the anode connection hole VHA of the second-type sub-pixel C2 are substantially on the same straight line. Such design is beneficial to form the anode connection hole through a patterning process.

The orthographic projection of the first anode structure 30A on the base substrate 100 covers an orthographic projection of the anode connection hole VHA of the first anode structure 30A on the base substrate 100. The anode body portion 31A of the first anode structure and the anode extension portion 32A of the first anode structure are located on opposite sides of the anode connection hole VHA of the first anode structure in the second direction Y.

Referring to FIG. 5, FIG. 7B and FIG. 11, the orthographic projection of the driving gate conductive portion (including the gate electrode G3 and the first connecting portion 71) of the first pixel driving circuit 10A on the base substrate 100 at least partially overlaps the orthographic projection of the second storage capacitor electrode Cst2 of the first pixel driving circuit 10A on the base substrate 100, so as to form a fifth overlapping region. The orthographic projection of the driving gate conductive portion (including the gate electrode G3 and the first connecting portion 71) of the second pixel driving circuit 10B on the base substrate 100 at least partially overlaps the orthographic projection of the second storage capacitor electrode Cst2 of the second pixel driving circuit 10B on the base substrate 100, so as to form a sixth overlapping region. A ratio of an area of the fifth overlapping region to an area of the sixth overlapping region is in a range from 0.8 to 1.2, for example, in a range from 0.85 to 1.15, in a range from 0.9 to 1.1. Alternatively, the area of the fifth overlapping region is substantially equal to the area of the sixth overlapping region. In this way, the storage capacitor Cst of each sub-pixel may have substantially the same value.

Referring to FIG. 7B and FIG. 11, the second storage capacitor electrode Cst2 includes a body portion Cst20 and a via hole VH2 in the body portion. The via hole VH2 exposes a part of the gate electrode G3 covered by the second storage capacitor electrode, and the first connecting portion 71 is electrically connected to the gate electrode G3 through the via hole VH2.

The orthographic projection of the conductive plug 711 on the base substrate 100 falls within an orthographic projection of the via hole VH2 of the second storage capacitor electrode of the first pixel driving circuit on the base substrate 100. For example, an area of the orthographic projection of the conductive plug 711 of the first pixel driving circuit 10A on the base substrate 100 is greater than an area of the orthographic projection of the conductive plug 711 of the second pixel driving circuit 10B on the base substrate 100.

In embodiments of the present disclosure, an area of the orthographic projection of the via hole VH2 of the second storage capacitor electrode Cst2 of the first pixel driving circuit 10A on the base substrate 100 is greater than an area of the orthographic projection of the via hole VH2 of the second storage capacitor electrode Cst2 of the second pixel driving circuit 10B on the base substrate 100. For example, the via hole VH2 of the second storage capacitor electrode Cst2 has a first size W3 in the first direction X and a second size H3 in the second direction Y. The first size W3 of the via hole VH2 of the second storage capacitor electrode Cst2 of the first pixel driving circuit 10A is substantially equal to the first size W3 of the via hole VH2 of the second storage capacitor electrode Cst2 of the second pixel driving circuit 10B. The second size H3 of the via hole VH2 of the second storage capacitor electrode Cst2 of the first pixel driving circuit 10A is greater than the second size H3 of the via hole VH2 of the second storage capacitor electrode Cst2 of the second pixel driving circuit 10B. In this way, the area of the second storage capacitor electrode Cst2 of the first pixel driving circuit 10A may be reduced, which may help to achieve a consistency of the storage capacitor of each sub-pixel.

Referring to FIG. 1, FIG. 15 and FIG. 18, the display substrate includes a plurality of pixel units on the base substrate 100, and each of the pixel units includes a first-color sub-pixel SP1, a second-color sub-pixel SP2 and a third-color sub-pixel SP3. At least one selected from the first-color sub-pixel SP1, the second-color sub-pixel SP2 and the third-color sub-pixel SP3 in the same pixel unit is the first-type sub-pixel C1, and at least another one selected from the first-color sub-pixel SP1, the second-color sub-pixel SP2 and the third-color sub-pixel SP3 in the same pixel unit is the second-type sub-pixel C2. For example, for any two pixel units adjacent in the first direction, one of the first-color sub-pixel SP1, the second-color sub-pixel SP2 and the third-color sub-pixel SP3 in one pixel unit is the first-type sub-pixel C1, and two of the first-color sub-pixel SP1, the second-color sub-pixel SP2 and the third-color sub-pixel SP3 in the other pixel unit are the first-type sub-pixels C1.

Referring to FIG. 11, for the first-color sub-pixel SP1, the second-color sub-pixel SP2 and the third-color sub-pixel SP3 belonging to the first-type sub-pixel C1, an area of the orthographic projection of the first connecting portion 71 of the first pixel driving circuit of the third-color sub-pixel SP3 on the base substrate is greater than an area of the orthographic projection of the first connecting portion 71 of the first pixel driving circuit of the second-color sub-pixel SP2 on the base substrate 100.

For the first-color sub-pixel SP1, the second-color sub-pixel SP2 and the third-color sub-pixel SP3 belonging to the first-type sub-pixel C1, an area of the orthographic projection of the first connecting portion 71 of the first pixel driving circuit of the second-color sub-pixel SP2 on the base substrate is greater than an area of the orthographic projection of the first connecting portion 71 of the first pixel driving circuit of the first-color sub-pixel SP1 on the base substrate.

For the sub-pixels having the same color which belong to the first-type sub-pixel C1 and the second-type sub-pixel C2 respectively, a ratio of the area of the orthographic projection of the first connecting portion 71 of the first pixel driving circuit 10A on the base substrate to the area of the orthographic projection of the first connecting portion 71 of the second pixel driving circuit 10B on the base substrate is in a range from 1.1 to 1.8.

That is, in embodiments of the present disclosure, the area of the first connecting portion 71 in the first-type sub-pixel C1 is increased by about 10% to 80% compared with the area of the first connecting portion 71 in the second-type sub-pixel C2 having the same color with the first-type sub-pixel C1. The inventors found through researches that with such design, the capacitance inconsistency between the two types of sub-pixels may be compensated well.

At least some embodiments of the present disclosure further provide a display panel, including the above-mentioned display substrate. For example, the display panel may be an OLED display panel.

Referring to FIG. 1, at least some embodiments of the present disclosure further provide a display apparatus, which may include the above-mentioned display substrate.

The display apparatus may include any apparatus or product having a display function. For example, the display apparatus may be a smart phone, a mobile phone, an e-book reader, a desktop personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo, or smart watch), a television, etc.

It should be understood that the display panel and the display apparatus according to embodiments of the present disclosure have all the features and advantages of the above-mentioned display substrate. The details may be referred to the above descriptions and will not be repeated here.

Although some embodiments of general technical concepts of the present disclosure have been illustrated and described, it should be understood by those ordinary skilled in the art that these embodiments may be changed without departing from the principle and spirit of the general technical concepts of the present disclosure. The scope of the present disclosure is defined by the claims and their equivalents.

The invention claimed is:

1. A display substrate, comprising:
   a base substrate;
   a first pixel driving circuit on the base substrate;
   a first anode structure on the base substrate;
   a second pixel driving circuit on the base substrate; and
   a second anode structure on the base substrate,
   wherein an orthographic projection of the first anode structure on the base substrate at least partially overlaps an orthographic projection of an occupation region of the first pixel driving circuit on the base substrate so as to form a first overlapping region, an orthographic projection of the second anode structure on the base substrate at least partially overlaps an orthographic projection of an occupation region of the second pixel driving circuit on the base substrate so as to form a second overlapping region, and an area of the first overlapping region is less than an area of the second overlapping region;
   wherein the first pixel driving circuit comprises a driving gate conductive portion, the driving gate conductive portion of the first pixel driving circuit comprises a gate electrode of a driving transistor of the first pixel driving circuit, and the orthographic projection of the first anode structure on the base substrate at least partially overlaps an orthographic projection of the driving gate conductive portion of the first pixel driving circuit on the base substrate so as to form a third overlapping region;

wherein the second pixel driving circuit comprises a driving gate conductive portion, the driving gate conductive portion of the second pixel driving circuit comprises a gate electrode of a driving transistor of the second pixel driving circuit, the orthographic projection of the second anode structure on the base substrate at least partially overlaps an orthographic projection of the driving gate conductive portion of the second pixel driving circuit on the base substrate so as to form a fourth overlapping region, and a ratio of an area of the third overlapping region to an area of the fourth overlapping region is in a range from 0.8 to 1.2;

wherein an area of the orthographic projection of the driving gate conductive portion of the first pixel driving circuit on the base substrate is greater than an area of the orthographic projection of the driving gate conductive portion of the second pixel driving circuit on the base substrate;

wherein the driving gate conductive portion of the first pixel driving circuit further comprises a first connecting portion electrically connected to the gate electrode of the driving transistor of the first pixel driving circuit, the driving gate conductive portion of the second pixel driving circuit further comprises a first connecting portion electrically connected to the gate electrode of the driving transistor of the second pixel driving circuit, and an area of an orthographic projection of the first connecting portion of the first pixel driving circuit on the base substrate is greater than an area of an orthographic projection of the first connecting portion of the second pixel driving circuit on the base substrate.

2. The display substrate according to claim 1, further comprising:

a plurality of sub-pixels on the base substrate, wherein the plurality of sub-pixels are arranged in an array in a first direction and a second direction, wherein the plurality of sub-pixels comprise a first-type sub-pixel and a second-type sub-pixel, the first-type sub-pixel comprises the first pixel driving circuit and a first light emitting device, the first pixel driving circuit is electrically connected to the first light emitting device to drive the first light emitting device to emit light, the second-type sub-pixel comprises the second pixel driving circuit and a second light emitting device, and the second pixel driving circuit is electrically connected to the second light emitting device to drive the second light emitting device to emit light;

wherein the first light emitting device comprises the first anode structure, the second light emitting device comprises the second anode structure, and the orthographic projection of the first anode structure on the base substrate and the orthographic projection of the second anode structure on the base substrate are arranged in different rows; and wherein a ratio of an area of an orthographic projection of the gate electrode of the driving transistor of the first pixel driving circuit on the base substrate to an area of an orthographic projection of the gate electrode of the driving transistor of the second pixel driving circuit on the base substrate is in a range from 0.8 to 1.2.

3. The display substrate according to claim 2, wherein the first anode structure comprises an anode body portion and an anode extension portion extending from the anode body portion to the first pixel driving circuit, an orthographic projection of the gate electrode of the driving transistor and the first connecting portion of the first pixel driving circuit on the base substrate at least partially overlaps an orthographic projection of the anode extension portion of the first anode structure on the base substrate, so as to form the third overlapping region.

4. The display substrate according to claim 3, wherein the orthographic projection of the gate electrode of the driving transistor and the first connecting portion of the first pixel driving circuit on the base substrate is spaced apart from an orthographic projection of the anode body portion of the first anode structure on the base substrate.

5. The display substrate according to claim 4, wherein an orthographic projection of the gate electrode of the driving transistor and the first connecting portion of the second pixel driving circuit on the base substrate at least partially overlaps an orthographic projection of the anode body portion of the second anode structure on the base substrate, so as to form the fourth overlapping region.

6. The display substrate according to claim 5, wherein each of the first pixel driving circuit and the second pixel driving circuit comprises a storage capacitor, the storage capacitor comprises a first storage capacitor electrode and a second storage capacitor electrode, an orthographic projection of the first storage capacitor electrode on the base substrate at least partially overlaps an orthographic projection of the second storage capacitor electrode on the base substrate, and the first storage capacitor electrode comprises the driving gate conductive portion, and wherein an area of the orthographic projection of the second storage capacitor electrode of the first pixel driving circuit on the base substrate is less than an area of the orthographic projection of the second storage capacitor electrode of the second pixel driving circuit on the base substrate.

7. The display substrate according to claim 6, wherein the orthographic projection of the driving gate conductive portion of the first pixel driving circuit on the base substrate at least partially overlaps the orthographic projection of the second storage capacitor electrode of the first pixel driving circuit on the base substrate, so as to form a fifth overlapping region, and wherein the orthographic projection of the driving gate conductive portion of the second pixel driving circuit on the base substrate at least partially overlaps the orthographic projection of the second storage capacitor electrode of the second pixel driving circuit on the base substrate, so as to form a sixth overlapping region, and wherein a ratio of an area of the fifth overlapping region to an area of the sixth overlapping region is in a range from 0.8 to 1.2.

8. The display substrate according to claim 7, wherein the display substrate comprises:

a semiconductor layer on the base substrate;

a first conductive layer on a side of the semiconductor layer away from the base substrate;

a second conductive layer on a side of the first conductive layer away from the base substrate;

a third conductive layer on a side of the second conductive layer away from the base substrate; and a first electrode layer on a side of the third conductive layer away from the base substrate, wherein for each of the first pixel driving circuit and the second pixel driving circuit, the gate electrode of the driving transistor is located in the first conductive layer, the second storage capacitor electrode is located in the second conductive layer, and the first connecting portion is located in the third conductive layer; and
wherein the first anode structure and the second anode structure are located in the first electrode layer.

9. The display substrate according to claim 8, wherein the second storage capacitor electrode comprises a body portion and a via hole in the body portion, wherein for each of the first pixel driving circuit and the second pixel driving circuit, the via hole exposes a part of the gate electrode of the driving transistor covered by the second storage capacitor electrode, and the first connecting portion is electrically connected to the gate electrode of the driving transistor through the via hole, and
wherein the first connecting portion of the first pixel driving circuit comprises a conductive plug, an orthographic projection of the conductive plug on the base substrate falls within an orthographic projection of the via hole of the second storage capacitor electrode of the first pixel driving circuit on the base substrate, and an area of the orthographic projection of the conductive plug of the first pixel driving circuit on the base substrate is greater than an area of an orthographic projection of a conductive plug of the second pixel driving circuit on the base substrate.

10. The display substrate according to claim 9, wherein the first connecting portion of the first pixel driving circuit further comprises a first connecting sub-portion and a second connecting sub-portion, and for the first pixel driving circuit, the first connecting sub-portion, the conductive plug and the second connecting sub-portion are formed as an integral structure, and
wherein an orthographic projection of the first connecting sub-portion on the base substrate and an orthographic projection of the second connecting sub-portion on the base substrate are on opposite sides of the orthographic projection of the via hole on the base substrate,
wherein an area of the orthographic projection of the via hole of the second storage capacitor electrode of the first pixel driving circuit on the base substrate is greater than an area of the orthographic projection of the via hole of the second storage capacitor electrode of the second pixel driving circuit on the base substrate.

11. The display substrate according to claim 2, wherein the plurality of sub-pixels comprise adjacent $(n+1)^{th}$ row of sub-pixels and $n^{th}$ row of sub-pixels, the $(n+1)^{th}$ row of sub-pixels comprises a plurality of first-type sub-pixels, the nth row of sub-pixels comprises a plurality of second-type sub-pixels, wherein n is a positive integer, and
wherein orthographic projections of first pixel driving circuits of the plurality of first-type sub-pixels in the $(n+1)^{th}$ row of sub-pixels on the base substrate and orthographic projections of second pixel driving circuits of the plurality of second-type sub-pixels in the nth row of sub-pixels on the base substrate are arranged side by side in a same row in the first direction, and
wherein orthographic projections of first anode structures of the plurality of first- type sub-pixels in the $(n+1)^{th}$ row of sub-pixels on the base substrate and orthographic projections of second anode structures of the plurality of second-type sub-pixels in the nth row of sub-pixels on the base substrate are arranged in different rows, and the first anode structures and the second anode structures are alternately arranged in the first direction,
wherein an anode extension portion of the first anode structure of the plurality of first-type sub-pixels in the $(n+1)^{th}$ row of sub-pixels is between the second anode structures of two second-type sub-pixels in the nth row of sub-pixels in the first direction,
wherein the display substrate comprises a plurality of pixel units on the base substrate, and each of the pixel units comprises a first-color sub-pixel, a second-color sub-pixel and a third-color sub-pixel, and
wherein at least one selected from the first-color sub-pixel, the second-color sub- pixel or the third-color sub-pixel in a same pixel unit is the first-type sub-pixel, and at least another one selected from the first-color sub-pixel, the second-color sub-pixel or the third-color sub-pixel in the same pixel unit is the second-type sub-pixel.

12. The display substrate according to claim 11, wherein for any two pixel units adjacent in the first direction, one of the first-color sub-pixel, the second-color sub-pixel or the third-color sub-pixel in one pixel unit is the first-type sub-pixel, and two of the first-color sub-pixel, the second-color sub-pixel and the third-color sub-pixel in the other pixel unit are the first type sub-pixels; and/or
wherein for the first-color sub-pixel, the second-color sub-pixel and the third- color sub-pixel belonging to the first-type sub-pixel, an area of an orthographic projection of the first connecting portion of the first pixel driving circuit of the third-color sub-pixel on the base substrate is greater than an area of an orthographic projection of the first connecting portion of the first pixel driving circuit of the second-color sub-pixel on the base substrate; and/or
for the first-color sub-pixel, the second-color sub-pixel and the third-color sub- pixel belonging to the first-type sub-pixel, an area of an orthographic projection of the first connecting portion of the first pixel driving circuit of the second-color sub-pixel on the base substrate is greater than an area of an orthographic projection of the first connecting portion of the first pixel driving circuit of the first-color sub-pixel on the base substrate.

13. The display substrate according to claim 2, wherein the display substrate further comprises: a data signal line configured to transmit a data signal; and a driving voltage line configured to transmit a driving voltage;
the data signal line, the driving voltage line and the first connecting portion of each of the first pixel driving circuit and the second pixel driving circuit are in a third conductive layer; and
the data signal line, the driving voltage line and the first connecting portion of each of the first pixel driving circuit and the second pixel driving circuit extend in the second direction, and
wherein the display substrate further comprises a shielding portion in the second conductive layer, the driving voltage line comprises a bending portion bending in a direction away from a data signal line adjacent to the driving voltage line, and an orthographic projection of the bending portion of the driving voltage line on the base substrate at least partially overlaps an orthographic projection of the shielding portion on the base substrate.

14. The display substrate according to claim 2, wherein for same-color sub- pixels belonging to the first-type sub-pixel and the second-type sub-pixel respectively, a ratio of an area of an orthographic projection of the first connecting portion of the first pixel driving circuit on the base substrate to an area of an orthographic projection of the first connecting portion of the second pixel driving circuit on the base substrate is in a range from 1.1 to 1.8.

15. The display substrate according to claim 3, wherein a width of the anode extension portion of the first anode structure in the first direction is less than a width of the anode body portion of the first anode structure in the first direction.

16. The display substrate according to claim 11, wherein for the adjacent $(n+1)^{th}$ row of sub-pixels and $n^{th}$ row of sub-pixels, the first anode structures of the first-type sub-pixels are electrically connected to respective first pixel driving circuits through respective anode connection holes, and the second anode structures of the second-type sub-pixels are electrically connected to respective second pixel driving circuits through respective anode connection holes, and wherein for the adjacent $(n+1)^{th}$ row of sub-pixels and nth row of sub-pixels, the anode connection holes of the first-type sub-pixels and the anode connection holes of the second-type sub-pixels are substantially on a same straight line, and wherein the orthographic projection of the first anode structure on the base substrate covers an orthographic projection of the anode connection hole of the first anode structure on the base substrate, and wherein an anode body portion and the anode extension portion of the first anode structure are on opposite sides of the anode connection hole of the first anode structure in the second direction.

17. The display substrate according to claim 1, wherein an orthographic projection of the first pixel driving circuit on the base substrate and an orthographic projection of the second pixel driving circuit on the base substrate are arranged side by side in a same row in a first direction.

18. A display apparatus, comprising the display substrate according to claim 1.

* * * * *